United States Patent
Hotta et al.

(12) 
(10) Patent No.: US 6,329,122 B2
(45) Date of Patent: Dec. 11, 2001

(54) PROCESS FOR THE PREPARATION OF PHOTOSENSITIVE LITHOGRAPHIC PRINTING PLATE

(75) Inventors: Hisashi Hotta; Akio Uesugi, both of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/469,280

(22) Filed: Dec. 22, 1999

(30) Foreign Application Priority Data

Dec. 22, 1998 (JP) .................................................. 10-364947

(51) Int. Cl.⁷ .............................. G03C 1/77; G03F 7/09; B41N 1/08
(52) U.S. Cl. ........................................ 430/278.1; 430/302
(58) Field of Search .............................. 430/271.1, 278.1, 430/302

(56) References Cited

U.S. PATENT DOCUMENTS 4,650,739 * 3/1987 Simon et al. ......................... 430/161
6,022,667 * 2/2000 Vermeersch et al. .............. 430/271.1
6,040,113 * 3/2000 Van Damme et al. ........... 430/271.1

FOREIGN PATENT DOCUMENTS

| 0 161 508 A | 11/1985 | (EP) . |
| 0 565 006 A | 10/1993 | (EP) . |
| 1084070 * | 9/1967 | (GB) . |
| 1 441 245 A | 6/1976 | (GB) . |
| 1 517 746 A | 7/1978 | (GB) . |
| 11059007A * | 3/1999 | (JP) . |

OTHER PUBLICATIONS

Derwent Abstract: Access No. 1999–224731→English Abstract of JP 11059007A Published on Mar. 02, 1999.*

* cited by examiner

*Primary Examiner*—Janet Baxter
*Assistant Examiner*—Sin J. Lee
(74) *Attorney, Agent, or Firm*—Sughrue, Mion, Zinn, Macpeak & Seas, PLLC

(57) ABSTRACT

A process for the preparation of a photosensitive lithographic printing plate which comprises providing a photosensitive layer on an aluminum support obtained by treating an anodized aluminum substrate with an aqueous solution having a pH value of from 1.5 to 5 is disclosed.

3 Claims, No Drawings

PROCESS FOR THE PREPARATION OF PHOTOSENSITIVE LITHOGRAPHIC PRINTING PLATE

FIELD OF THE INVENTION

The present invention relates to a process for the preparation of a photosensitive lithographic printing plate.

BACKGROUND OF THE INVENTION

In general, an aluminum support to be incorporated in lithographic printing plate is required to exhibit excellent water wettability and water receptivity. Thus, it is well known that an aluminum support is finely roughened by a mechanical, chemical or electrochemical process so that it is grained. It is further known that the surface of the aluminum support thus grained is anodized to enhance the mechanical strength and even the water receptivity thereof. The aluminum support which has thus been anodized is then rinsed. During this procedure, aluminum ions contained in the anodizing solution and dissolved upon anodization are retained on the aluminum support. During rinsing, these aluminum ions form aluminum hydroxide which is then attached to the aluminum support to mar the external appearance. In order to eliminate this defect, it has been heretofore practiced to intensify rinsing. However, this approach is disadvantageous in that the required amount of rinsing water is increased, adding to the production cost.

SUMMARY OF THE INVENTION

It is therefore an abject of the present invention to provide a process for the preparation of an aluminum support for photosensitive lithographic printing plate which allows little production of aluminum hydroxide without increasing the amount of rinsing water to be used in rinsing after anodization and allows little attachment of aluminum hydroxide to the aluminum support to prevent defective external appearance.

The inventors made extensive studies of the accomplishment of the foregoing object of the present invention As a result, it was found that when an aluminum substrate which has been anodized is treated with an aqueous solution having a pH value of 15 to 5 before rinsed, the production of aluminum hydroxide during rinsing can be inhibited, making it possible to prevent defects caused by aluminum hydroxide. The present invention has thus been worked out.

The present invention concerns a process for the preparation of a photosensitive lithographic printing plate which comprises providing a photosensitive layer on an aluminum support obtained by treating an anodized aluminum substrate with an aqueous solution having a pH value of from 1.5 to 5.

Another embodiment of the present invention is a process for the preparation of a photosensitive lithographic printing plate which comprises treating an anodized aluminum substrate with an aqueous solution having a pH value of from 1.5 to 5, treating said anodized aluminum substrate with a silicate of alkaline metal so that the amount of Si atom attached to the aluminum support thus obtained reached from 0.1 to 8 mg/m$^2$, and then providing a positive-working photosensitive layer on said aluminum support.

DETAILED DESCRIPTION OF THE INVENTION

The photosensitive lithographic printing plate according to the present invention will be further described with reference to support, interlayer, positive-working photosensitive layer and development process in this order.

Firstly, the support to be incorporated in the photosensitive lithographic printing plate of the present invention and its treatment will be described hereinafter.

(Aluminum Plate)

The aluminum plate to be used in the present invention is a plate-like body made of pure aluminum or aluminum alloy comprising aluminum as a main component and a slight amount of foreign elements. Examples of these foreign elements include silicon, iron, manganese, copper, magnesium, chromium, zinc, bismuth, nickel, and titanium. The aluminum alloy preferably comprises such foreign elements in an amount of not greater than 10% by weight. Aluminum suitable for the present invention is pure aluminum. However, since completely pure aluminum can hardly be produced from the standpoint of refining technique, aluminum comprising foreign elements in an amount as little as possible may be used. Any aluminum alloy comprising foreign elements in the above defined amount may be used in the present invention. The aluminum plate to be used in the present invention is not specifically limited in its formulation. Any known commonly used material may be properly used. Preferred examples of such a known include those according to JIS A1050, JIS A1100, JIS A1200, JIS A3003, JIS A3103 and JIS A3005. The thickness of the aluminum plate to be used in the present invention is from about 0.1 mm to 0.6 mm. Prior to being roughened, the aluminum plate is optionally subjected to degreasing, i.e., treatment with a surface active agent or alkaline aqueous solution to remove rolling oil from the surface thereof.

(Roughening and Anodization)

In general, the foregoing aluminum plate is firstly roughened on the surface thereof. The surface roughening of the aluminum plate can be accomplished by mechanical roughening method, electrochemical dissolution-roughening method or chemical selective dissolution method. As the mechanical roughening method there may be used any known method such as ball abrasion method, brush abrasion method, blast abrasion method and buffing. The electrochemical roughening method may be carried out using alternating current or direct current in a hydrochloric acid or nitric acid as an electrolyte. A combination of the mechanical roughening method and the electrochemical roughening method as disclosed in JP-A-54-63902 (The term "JP-A" as used herein means an "unexamined published Japanese patent application") may be used.

The aluminum plate which has thus been roughened is optionally alkalinically etched and neutralized, and then anodized to enhance its water receptivity or abrasion resistance. As the electrolyte to be used in the anodization of aluminum plate there may be used any electrolyte with which a porous oxide layer can be formed. In general, sulfuric acid, phosphoric acid, oxalic acid, chromic acid or mixture thereof may be used. The concentration of such an electrolyte may be properly predetermined according to the kind of the electrolyte.

The anodization conditions vary with the kind of the electrolyte used and thus cannot be unequivocally predetermined. In general, it is preferred that the concentration of the electrolyte be from 1 to 80% by volume, the liquid temperature be from 5 to 70° C., the current density be from 5 to 60 A/cm$^2$, the voltage be from 1 to 100 V and the electrolysis time be from 10 seconds to 5 minutes.

The amount of anodized layer is preferably not less than 1.0 g/m$^2$, more preferably from 2.0 to 6.0 g/m$^2$. If the amount of anodized layer falls below 1.0 g/m$^2$, the resulting printing durability is insufficient. Further, the resulting lithographic printing plate can be easily scratched on the non-image area, occasionally causing so-called "scratch scumming", i.e., attachment with ink on scratched area during printing.

The anodization is made on the support of lithographic printing plate at the surface to be used for printing- Since lines of electric force reach the other surface of the support, it is usual that an anodized layer is formed on the other surface of the support in an amount of from 0.01 to 3 $g/m^2$.

(Treatment with Acidic Aqueous Solution)

In the present invention, the aluminum support which has thus been anodized is treated with an acidic aqueous solution having a pH value of from 1.5 to 5, preferably from 2 to 4 to inhibit the formation of aluminum hydroxide and the attachment of aluminum hydroxide to the aluminum support, making it possible to eliminate defective external appearance. If the pH value of the electrolyte is lower than 1.5, the anodized layer is dissolved in the electrolyte, increasing the diameter of pores in the anodized layer that can render the aluminum support more stainable. On the contrary, if the pH value of the electrolyte is higher than 5,, the formation of oxide layer cannot be prevented, making it impossible to inhibit the occurrence of defective external appearance caused by aluminum oxide.

The treatment temperature is from 10° C. to 40° C., preferably from 15° C. to 30° C. If the treatment temperature, exceeds 40° C., the anodized layer is liable to dissolution, increasing the diameter of pores in the anodized layer that can render the aluminum support more stainable.

On the contrary, even if the treatment temperature falls below 10° C., the effect of inhibiting the formation of aluminum hydroxide remains the same, but cooling adds to the production cost to disadvantage.

The treatment time is from 0.5 to 120 seconds, preferably from 3 to 20 seconds.

(Hydrophilic treatment)

As the silicate of alkaline metal to be used in the hydrophilic treatment of the present invention there may be used sodium silicate, potassium silicate, lithium silicate or the like.

The hydrophilic treatment may be preferably carried out by dipping an aluminum plate which has been anodized in an aqueous solution of silicate of alkaline metal having a concentration of from 0.01 to 30% by weight, preferably from 0.01 to 10% by weight, particularly from 0.05 to 3% by weight and a pH value (25° C.) of from 10 to 13 at a temperature of from 4° C. to 80° C. for 0.5 to 120 seconds, preferably 2 to 30 seconds, under conditions such as concentration of silicate of alkaline metal, treatment temperature and treatment time properly predetermined such that the attached amount of Si atom falls within the above defined range. If the pH value of the aqueous solution of silicate of alkaline metal with which the hydrophilic treatment is effected falls below 10, the aqueous solution undergoes gelation. On the contrary, if the pH value of the aqueous solution of silicate of alkaline metal exceeds 13.0, the anodized layer is dissolved. Care must be taken in this respect.

In the hydrophilic treatment according to the present invention, the aqueous solution of silicate of alkaline metal may optionally comprise hydroxides incorporated therein to adjust the pH value thereof to a high range. Examples of these hydroxides include sodium hydroxide, potassium hydroxide, and lithium hydroxide.

If necessary, the aqueous solution of silicate of alkaline metal may comprise a salt of alkaline earth metal or metal belonging to the group IVB in the periodic table. Examples of the foregoing salt of alkaline metal include water-soluble salts such as nitrate (e.g., calcium nitrate, strontium nitrate, magnesium nitrate, barium nitrate), sulfate, hydrochloride, phosphate, acetate, oxalate and borate of alkaline earth metal Examples of the foregoing salt of metal belonging to the group IVB in the periodic table include titanium tetrachloride, titanium trichloride, titanium potassium fluoride, titanium potassium oxalate, titanium sulfate, titanium tetraiodide, chlorinated zirconium oxide, zirconium dioxide, zirconium oxychloride, and zirconium tetrachloride. These metals of alkaline earth metal or salts of metal belonging to the group IVB in the periodic table may be used singly or in combination. The amount of these metal salts to be used herein is preferably from 0.01 to 10% by weight, more preferably from 0.05 to 5.0% by weight.

If a positive-working photosensitive layer is used, the amount of metal silicate to be attached to the surface of the aluminum support needs to be from 0.1 to 8 $mg/m^2$, preferably from 0.5 to 6 $mg/m^2$ as calculated in terms of Si atom. If the attached amount of metal silicate falls below 0.1 $mg/m^2$ as calculated in terms of Si atom, the resulting aluminum support exhibits raised scumming, making it impossible to accomplish the desired effect of the present invention. Further, if a developer free of silicate of alkaline metal is used, the whitening on the non-image area during development or the occurrence of refuse or sludge during development cannot be prevented. On the contrary, if the attached amount of metal silicate exceeds 8 $mg/^2$ as calculated in terms of Si atom, the resulting printing durability is deteriorated, making it impossible to accomplish the desired effect of the present invention.

In the present invention, the amount of the foregoing silicate of alkaline metal attached to the surface of the aluminum support can be measured by means of an X-ray fluorescence spectrometer (XRF) as calculated in terms of amount of Si atom (mg of $Si/m^2$) As the standard specimen from which calibration curve is obtained there is used one obtained by uniformly dropping an aqueous solution containing a known amount of Si atom onto the aluminum substrate at a 30 mm φ area, and then drying the material. The type of the X-ray fluorescence spectrometer is not specifically limited. In the examples described later, a Type RIX3000 X-ray fluorescence spectrometer produced by Rigaku Corp. was used. The amount of Si atom was determined from the height of peak on Si—Kα spectrum under the following conditions.

Apparatus used: Type RIX3000, produced by Rigaku Corp

X-ray tube: Rh

Measuring spectrum: Si—Kα

Tube voltage: 50 kV

Tube current: 50 mA

Slit: Coarse

Spectral crystal: $RX_4$

Detector: F-PC

Area analyzed: 30 mmφ

Peak position (2θ): 144.75 deg.

Background (2θ): 140 70 deg., 146.85 deg.

Integrating time: 80 sec/sample (Treatment with Acidic Aqueous Solution)

In the present invention, the aluminum support which has thus been rendered hydrophilic may be optionally treated with an acidic aqueous solution. As such an acidic aqueous solution there may be used an aqueous solution of sulfuric acid, nitric acid, hydrochloric acid, oxalic acid, phosphoric acid or the like. The treatment with an acidic aqueous solution is preferably carried out by dipping the aluminum support which has been rendered hydrophilic in an aqueous solution of such an acid having a concentration of from 0.001 to 10% by weight, preferably from 0.01 to 1% by weight, at a temperature of from 15° C. to 70° C., preferably from 25° C. to 50° C., for 0.5 to 120 seconds, preferably 2 to 30 seconds. The foregoing treatment with an acidic aqueous solution makes it possible to adjust the amount of silicate of alkaline metal attached to the aluminum support by the hydrophilic treatment so that it is reduced.

(Backcoat)

In the present invention, a backcoat layer is optionally provided on the other surface of the aluminum support. As such a backcoat layer there may be preferably used a coating layer made of a metal oxide obtained by the hydrolyzation and polycondensation of an organic polymer compound described in JP-A-5-45885 or an organic or inorganic metal compound described in JP-A-6-35174.

Particularly preferred among these coating layers are those made of metal oxides obtained from an alkoxylated silicon compound such as $Si(OCH_3)_4$, $Si(OC_2H_5)_4$, $Si(OC_3H_7)_4$ and $Si(OC_4H_9)_4$ because they exhibit an excellent developability. These alkoxylated silicon compounds are inexpensive and easily available.

(Interlayer)

In the present invention, the aluminum support which has thus been anodized is optionally provided with an interlayer comprising an amino acid and salt thereof (e.g., salt of amino acid with alkaline metal such as Na an K, ammonium salt, hydrochloride, oxalate, acetate, phosphate) disclosed in JP-A-60-149491, amine having hydroxyl group and salt thereof (e.g., hydrochloride, oxalate, phosphate) disclosed in JP-A-60-232998 or compound containing amino group and phosphonic acid group or salt thereof disclosed in JP-A-63-165183.

Alternatively, a compound containing phosphonic acid group disclosed in JP-A-4-282637 may be incorporated in the interlayer.

The structure having a positive-working photosensitive layer incorporated therein will be further described hereinafter.

(Interlayer Comprising a Polymer Compound Having Acidic group and Onium Group)

As the polymer compound to be used in the formation of interlayer there may be preferably used a polymer compound having a constituent containing an acidic group optionally with a constituent containing an onium group. The acidic group constituting the polymer compound is preferably one having an acid dissociation index (pKa) of not greater than 7, more preferably —COOH, —SO$_3$H, —OSO$_3$H, —PO$_3$H$_2$, —OPO$_3$H$_2$, —CONHSO$_2$ or —SO$_2$NHSO$_2$—, particularly —COOH.

A preferred constituent having an acidic group is a polymerizable compound represented by the following general formula (1) or (2):

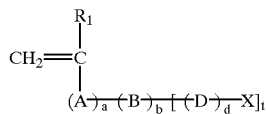

(1)

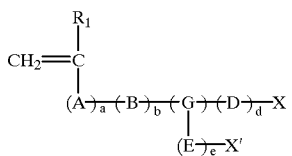

(2)

In the foregoing general formulae (1) and (2), A represents a divalent connecting group; B represents an aromatic group or substituted aromatic group; D and E each independently represent a divalent connecting group; G represents a trivalent connecting group; X and X' each independently represent an acidic group having pKa of not greater than 7 or salt thereof with an alkaline metal or ammonium; $R_1$ represents a hydrogen atom, an alkyl group or a halogen atom; the suffixes a, b, d and e each independently represent an integer of 0 or 1; and the suffix t represents an integer of from 1 to 3.

Referring to these constituents having an acidic group, A preferably represents —COO— or —CONH—. B represents a phenylene group or a substituted phenylene group. Examples of the substituents on the substituted phenylene group include a hydroxyl group, a halogen atom, and an alkyl group. D and E each independently represent an alkylene group or a divalent connecting group represented by the molecular formula $CH_nH_{2n}O$, $C_nH_{2n}S$ or $C_nH_{2n+1}N$. G represents a trivalent connecting group represented by the molecular formula $C_nH_{2n-1}$, $C_nH_{2n-1}O$, $C_nH_{2n-1}S$ or $C_nH_{2n}N$ in which n represents an integer of from 1 to 12. X and X' each independently represent carboxylic acid, sulfonic acid, phosphonic acid, sulfuric acid monoester or phosphoric acid monoester. $R_1$ represents a hydrogen atom or an alkyl group. The suffixes a, b, d and e each independently represent an integer of 0 or 1, with the proviso that a and b are not 0 at the same time Particularly preferred among the constituents having an acidic group is the compound represented by the foregoing general formula (1). B represents a phenylene group or a substituted phenylene group The substituent on the substituted phenylene group is a hydroxyl group or a $C_{1-3}$ alkyl group. D and E each independently represent a $C_{1-2}$ alkylene group or $C_{1-2}$ alkylene group having moieties connected to each other with oxygen atom. $R_1$ represents a hydrogen atom or a methyl group. X represents a carboxylic acid group. The suffix a represents an integer of 0. The suffix b represents an integer of 1.

Specific examples of the constituent having an acidic group will be given below, but the present invention should not be construed as being limited thereto.

Specific examples of the constituent having an acidic group include acrylic acid, methacrylic acid, crotonic acid, isocrotonic acid, itaconic acid, maleic acid, and maleic anhydride. Further examples of the constituent having an acidic group will be given below.

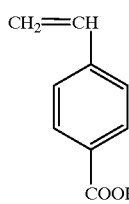 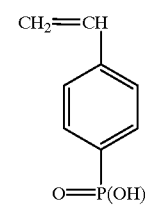 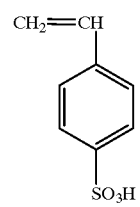

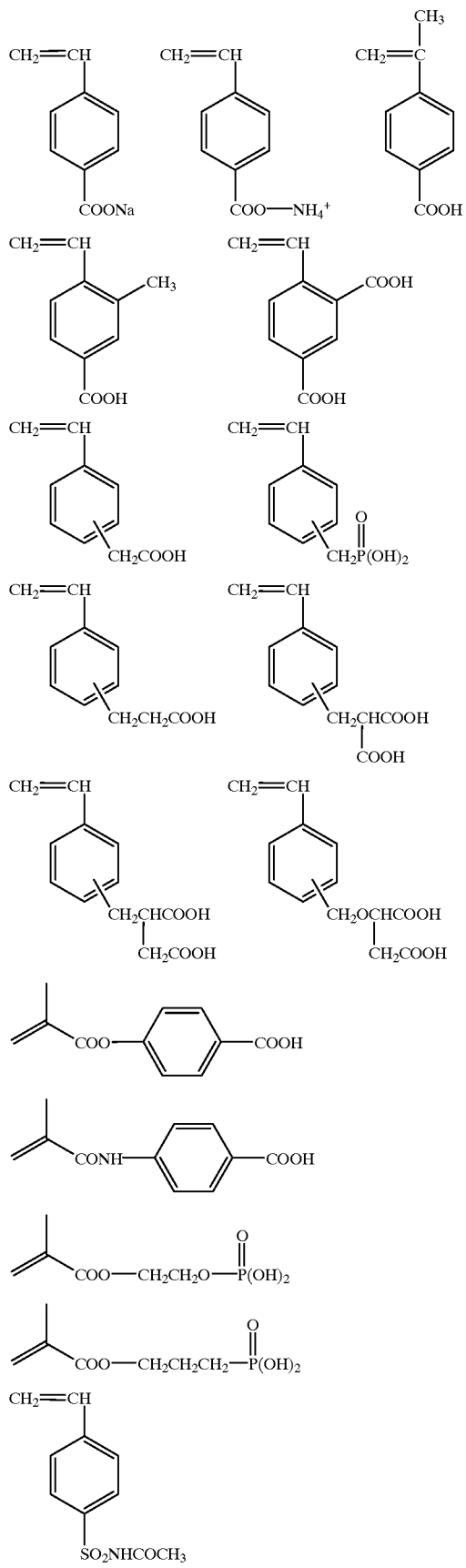
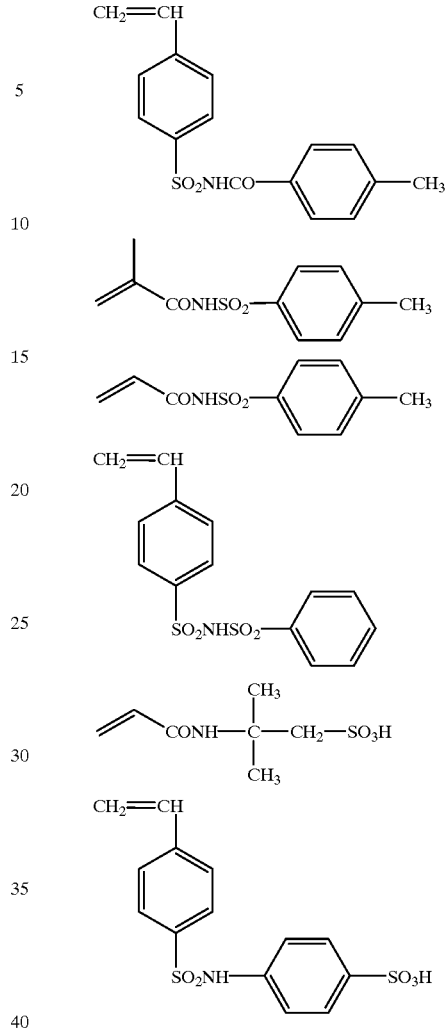

The foregoing constituents having an acidic group may be used singly or in combination.

(Interlayer Comprising a Polymer Compound Containing Onium Group)

As the onium group in the constituent of the polymer compound to be used in the formation of the foregoing interlayer there is preferably used an onium group comprising atoms belonging to the group V or VI in the periodic table. Preferred among these onium groups are those comprising nitrogen atom, phosphorus atom and sulfur atom. Particularly preferred among these onium groups is onium group comprising nitrogen atom.

The main chain structure of the polymer compound is an acrylic resin, methacrylic resin, vinyl polymer such as polystyrene, urethane resin or polymer such as polyester and polyamide. Particularly preferred among these main chain structures are acrylic resin, methacrylic resin and vinyl polymer such as polystyrene.

A particularly preferred example of the polymer compound is a polymer having an onium group-containing constituent which is a polymerizable compound represented by the following general formula (3), (4) or (5):

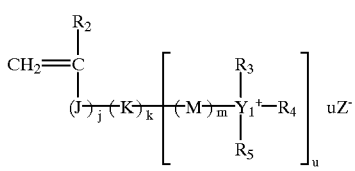

(3)

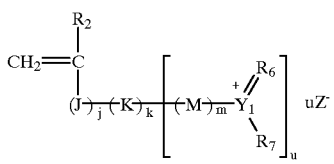

(4)

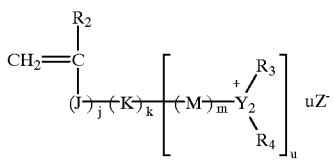

(5)

In the foregoing general formulae, J represents a divalent connecting group; K represents an aromatic group or a substituted aromatic group; M's each independently represent a divalent connecting group; $Y_1$ represents an atom belonging to the group V in the periodic table; $Y_2$ represents an atom belonging to the group VI in the periodic table; $Z^-$ represents a counter ion; $R_2$ represents a hydrogen atom, an alkyl group or a halogen atom; $R_3$, $R_4$, $R_5$, and $R_7$ each independently represent a hydrogen atom or an alkyl, aromatic or aralkyl group which may optionally comprise connecting groups connected thereto; $R_6$ represents an alkylidine group or a substituted alkylidiene group; $R_3$ and $R_4$ or $R_6$ and $R_7$ may be connected to each other to form a ring; the suffixes j, k and m each independently represent an integer of 0 or 1; and the suffix u represents an integer of from 1 to 3.

Referring to the constituent having onium group, J preferably represents —COO— or —CONH—. K preferably represents a phenylene group or substituted phenylene group. The substituenton the substituted phenylene group is a hydroxyl group, a halogen atom or an alkyl group. M preferably represents an alkylene group or a divalent connecting group represented by the molecular formula $C_nH_{2n}O$, $C_nH_{2n}S$ or $C_nH_{2n+1}N$ in which n represents an integer of from 1 to 12. $Y_1$ represents a nitrogen atom or phosphorus atom. $Y_2$ represents a sulfur atom. $Z^-$ represents a halogen ion, $PF_6^-$, $BF_4^-$ or $R_8SO_3^-$. $R_2$ represents a hydrogen atom or an alkyl group $R_3$, $R_4$, $R_5$ and $R_7$ each independently represent a hydrogen atom or a $C_{1-10}$ alkyl, aromatic or aralkyl group which may optionally comprise connecting groups connected thereto. $R_6$ represents a $C_{1-10}$ alkylidine group or a substituted alkylidine group. $R_8$ represents a $C_{1-10}$ alkyl, aromatic or aralkyl group which may optionally comprise connecting groups connected thereto. $R_3$ and $R_4$ or $R_6$ and $R_7$ may be connected to each other to form a ring. The suffixes j, k and m each independently represent an integer of 0 or 1, with the proviso that j and k are not 0 at the same time.

Referring further to the constituent having onium group, it is particularly preferred that K represent a phenylene group or substituted phenylene group. The substituent on the substituted phenylene group is a hydroxyl group or a $C_{1-3}$ alkyl group. M preferably represents a $C_{1-2}$ alkylene group or a $C_{1-2}$ alkylene group which comprises moieties connected to each other with oxygen atom. $Z^-$ preferably represents a chlorine ion or $R_8SO_3^-$. $R_2$ preferably represents a hydrogen atom or a methyl group. The suffix j represents an integer of 0. The suffix k represents an integer of 1.

Specific examples of the constituent having onium group will be given below, but the present invention should not be construed as being limited thereto.

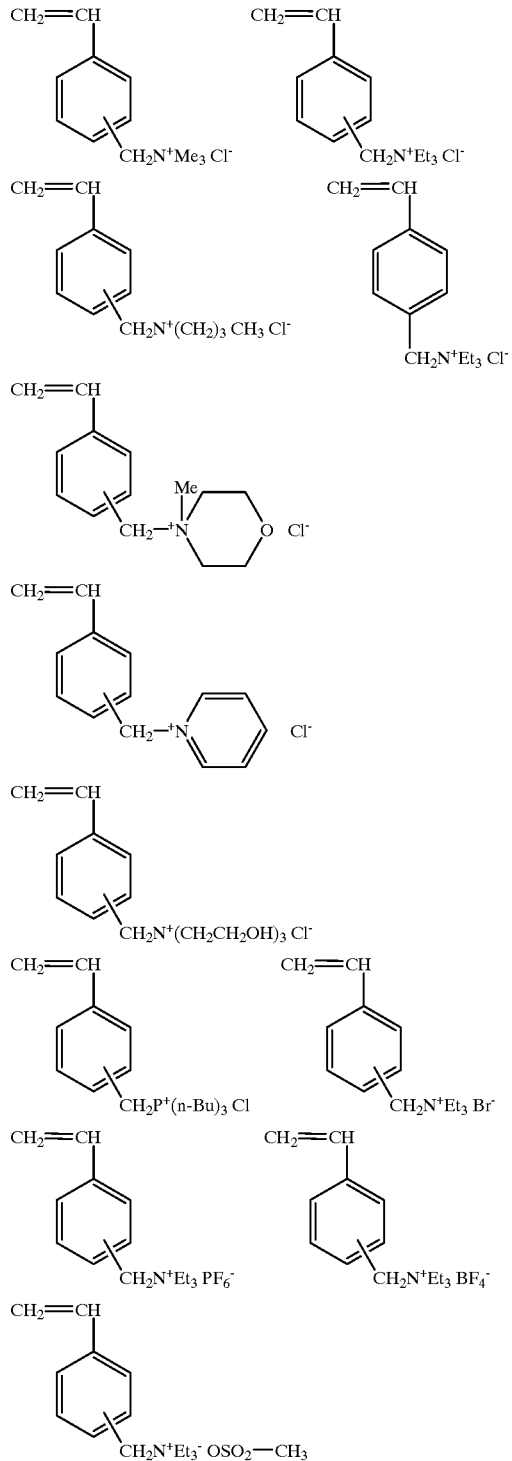

-continued

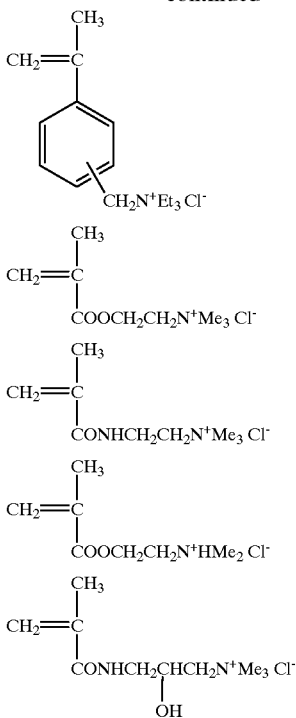

The polymer compound to be used in the formation of the interlayer comprises the foregoing constituent having onium group incorporated therein in an amount of not less than 1 mol %, more preferably not less than 5 mol %. If the constituent having onium group is incorporated in an amount of not less than 1 mol %, the resulting interlayer exhibits an even higher adhesivity.

These constituents having onium group may be used singly or in combination. Two or more polymer compounds having different constituents, composition ratios or molecular weights may be used in admixture to form the interlayer.

The polymer compound having an acidic group as well as an onium group preferably comprises a constituent having an acidic group and a constituent having an onium group in an amount of not less than 20 mol % and not less than 1 mol %, more preferably not less than 40 mol % and not less than 5 mol %, respectively. If the constituent having an acidic group is incorporated in the polymer compound in an amount of not less than 20 mol %, the removal by dissolution during development with an alkali is further accelerated. Further, the resulting synergistic effect of acidic group and onium group gives an even higher adhesivity. It goes without saying that two or more such polymer compounds having different constituents, composition ratios or molecular weights may be used in admixture.

Specific examples of the foregoing polymer compound having an acidic group as well as an onium group will be given below. The composition ratio of polymer structure is represented by mole percentage.

TABLE 1

Representative examples of polymer compound

| No. | Structure | Molecular weight (Mw) |
|---|---|---|
| 1 | —(CH₂—CH)₈₃— (phenyl-COOH)    —(CH₂—CH)₁₇— (phenyl-CH₂NMe₃⁺ Cl⁻) | 32,000 |
| 2 | —(CH₂—CH)₈₅— (phenyl-COOH)    —(CH₂—CH)₁₅— (phenyl-CH₂NEt₃⁺ Cl⁻) | 28,000 |
| 3 | —(CH₂—CH)₇₃— (phenyl-COOH)    —(CH₂—CH)₂₇— (phenyl-CH₂-N⁺(Me)(morpholino) Cl⁻) | 26,000 |

TABLE 1-continued

Representative examples of polymer compound

| No. | Structure | Molecular weight (Mw) |
|---|---|---|
| 4 | —(CH₂—CH)₆₄— (C₆H₄-COOH)  —(CH₂—CH)₃₆— (C₆H₄-CH₂-N⁺(pyridinium) Cl⁻) | 41,000 |
| 5 | —(CH₂—CH)₇₆— (C₆H₄-COOH)  —(CH₂—CH)₂₄— (C₆H₄-CH₂N⁺(CH₂CH₂OH)₃ Cl⁻) | 11,000 |
| 6 | —(CH₂—CH)₈₈— (C₆H₄-COOH)  —(CH₂—CH)₁₂— (C₆H₄-CH₂P⁺(n-Bu)₃ Cl⁻) | 17,000 |
| 7 | —(CH₂—CH)₅₈— (C₆H₄-SO₃H)  —(CH₂—CH)₄₂— (C₆H₄-CH₂P⁺(n-Bu)₃ Cl⁻) | 36,000 |
| 8 | —(CH₂—CH)₇₃— (C₆H₄-SO₃H)  —(CH₂—CH)₂₇— (C₆H₄-CH₂N⁺Et₃ Cl⁻) | 22,000 |
| 9 | —(CH₂—CH)₅₁— (C₆H₄-CH₂P(O)(OH)₂)  —(CH₂—CH)₃₆— (C₆H₄-CH₂-N⁺(pyridinium) Cl⁻) | 44,000 |
| 10 | —(CH₂—CH)₅₁— (C₆H₄-CH₂P(O)(OH)₂)  —(CH₂—CH)₄₉— (C₆H₄-CH₂N⁺Et₃ Cl⁻) | 19,000 |

TABLE 1-continued

Representative examples of polymer compound

| No. | Structure | Molecular weight (Mw) |
|---|---|---|
| 11 | —(CH$_2$—CH)$_{85}$—(C$_6$H$_4$—COOH) / —(CH$_2$—CH)$_{15}$—(C$_6$H$_4$—CH$_2$N$^+$Et$_3$ Br$^-$) | 28,000 |
| 12 | —(CH$_2$—CH)$_{85}$—(C$_6$H$_4$—COOH) / —(CH$_2$—CH)$_{15}$—(C$_6$H$_4$—CH$_2$N$^+$Et$_3$ BF$_4^-$) | 28,000 |
| 13 | —(CH$_2$—CH)$_{85}$—(C$_6$H$_4$—COOH) / —(CH$_2$—CH)$_{15}$—(C$_6$H$_4$—CH$_2$N$^+$Et$_3$ PF$_6^-$) | 28,000 |
| 14 | —(CH$_2$—C(CH$_3$))$_{78}$—COO—C$_6$H$_4$—COOH / —(CH$_2$—CH)$_{22}$—(C$_6$H$_4$—CH$_2$N$^+$Et$_3$ Cl$^-$) | 34,000 |
| 15 | —(CH$_2$—C(CH$_3$))$_{74}$—CONH—C$_6$H$_4$—COOH / —(CH$_2$—CH)$_{26}$—(C$_6$H$_4$—CH$_2$N$^+$Et$_3$ Cl$^-$) | 42,000 |
| 16 | —(CH$_2$—C(CH$_3$))$_{66}$—COO—C$_6$H$_4$—COOH / —(CH$_2$—CH)$_{34}$—COOCH$_2$CH$_2$N$^+$Me$_3$ Cl$^-$ | 13,000 |
| 17 | —(CH$_2$—CH)$_{48}$—(C$_6$H$_4$—CH$_2$P(O)(OH)$_2$) / —(CH$_2$—C(CH$_3$))$_{52}$—COOCH$_2$CH$_2$N$^+$Me$_3$ Cl$^-$ | 15,000 |

TABLE 1-continued

Representative examples of polymer compound

| No. | Structure | Molecular weight (Mw) |
|---|---|---|
| 18 | —(CH$_2$—C(CH$_3$))$_{64}$—COOCH$_2$CH$_2$OP(O)(OH)$_2$     —(CH$_2$—CH(CH$_3$))$_{36}$—CONHCH$_2$CH$_2$N$^+$Me$_3$ Cl$^-$ | 46,000 |
| 19 | —(CH$_2$—C(CH$_3$))$_{72}$—COO—C$_6$H$_4$—COOH     —(CH$_2$—CH(CH$_3$))$_{28}$—COOCH$_2$CH$_2$N$^+$HMe$_2$ Cl$^-$ | 34,000 |
| 20 | —(CH$_2$—C(CH$_3$)(COOH))$_{63}$—     —(CH$_2$—CH(C$_6$H$_4$-CH$_2$N$^+$Et$_3$ Cl$^-$))$_{37}$— | 63,000 |
| 21 | —(CH$_2$—CH(C$_6$H$_4$-COOH))$_{72}$—     —(CH$_2$—C(CH$_3$))$_{28}$—CONHCH$_2$CH(OH)CH$_2$N$^+$Me$_3$ Cl$^-$ | 25,000 |
| 22 | —(CH$_2$—C(CH$_3$))$_{82}$—CONH—C$_6$H$_4$—COOH     —(CH$_2$—C(CH$_3$))$_{18}$—CONHCH$_2$CH(OH)CH$_2$N$^+$Me$_3$ Cl$^-$ | 25,000 |
| 23 | —(CH$_2$—CH(C$_6$H$_4$-SO$_2$NHCO-C$_6$H$_4$-CH$_3$))$_{73}$—     —(CH$_2$—CH(C$_6$H$_4$-CH$_2$N$^+$Me$_3$ Cl$^-$))$_{27}$— | 33,000 |
| 24 | —(CH$_2$—C(CH$_3$))$_{66}$—CONHSO$_2$—C$_6$H$_4$—CH$_3$     —(CH$_2$—CH(C$_6$H$_4$-CH$_2$-N$^+$(pyridinium) Cl$^-$))$_{34}$— | 41,000 |

TABLE 1-continued

Representative examples of polymer compound

| No. | Structure | Molecular weight (Mw) |
|---|---|---|
| 25 | —(CH$_2$—CH)$_{81}$— (with phenyl-SO$_2$NHSO$_2$-phenyl); —(CH$_2$—CH)$_{19}$— (with phenyl-CH$_2$—N$^+$(pyridinium) Cl$^-$) | 14,000 |
| 26 | —(CH$_2$—CH)$_{75}$— CONH—C(CH$_3$)$_2$—CH$_2$—SO$_3$H; —(CH$_2$—CH)$_{25}$— (with phenyl-CH$_2$NEt$_3^+$ Cl$^-$) | 22,000 |
| 27 | —(CH$_2$—CH)$_{65}$— (with phenyl-COOH); —(CH$_2$—CH)$_{24}$— (with phenyl-CH$_2$NEt$_3^+$ Cl$^-$); —(CH$_2$—C(CH$_3$))$_{11}$— COOCH$_2$CH$_2$OH | 23,000 |
| 28 | —(CH$_2$—CH)$_{72}$— (with phenyl-COOH); —(CH$_2$—CH)$_{23}$— (with phenyl-CH$_2$NEt$_3^+$ Cl$^-$); —(CH$_2$—C(CH$_3$))$_5$— COOCH$_3$ | 47,000 |
| 29 | —(CH$_2$—CH)— (with phenyl-COOH) | 35,000 |

Process for the Preparation of Interlayer-forming Polymer compound)

Both the polymer compound having an acidic group and the polymer compound having an acidic group as well as an onium group to be used in the formation of the interlayer can be normally prepared by radical chain polymerization process (F. W. Billmeyer, *Textbook of Polymer Science*, 3rd 1984, A Wiley-Interscience Publication).

The molecular weight of the foregoing polymer pound may be widely ranged. In practice, however, the polymer compound preferably exhibits a weight-average molecular weight (Mw) of from 500 to 2,000,000, more preferably from 2,000 to 600,000, as determined by light ttering method. The polymer compound may comprise reacted monomers in a wide range of amount. In practice, ever, the content of unreacted monomers is preferably not greater than 20% by weight, more preferably not greater than 10% by weight.

With reference to the foregoing copolymer of p-vinylbenzoic acid with vinylbenzyl trimethylammonium chloride (No. 1 in Table 1) as one of representative examples of the polymer compound comprising an acidic group as well as an onium group, an example of the process for the synthesis of such a polymer compound will be given below.

146.9 g (0.99 mol) of p-vinylbenzoic acid (produced by HOKKO CHEMICAL INDUSTRY CO., LTD.), 44.2 g (0.21 mol) of vinylbenzyl trimethylammonium chloride and 446 g of 2-methoxyethanol were charged in a 1-liter three-necked flask. The mixture was heated to and kept at a temperature of 75° C. with stirring in a stream of nitrogen.

Subsequently, to the mixture was added 2.76 g (12 mmol) of 2, 2-azobis (isobutyric acid) dimethyl. The mixture was then stirred. After two hours, to the mixture was further added 2.76 g (12 nmol) of 2,2-azobis(isobutyric acid)dimethyl. After two hours, to the mixture was further added 2.76 g (12 mmol) of 2,2-azobis(isobutyric acid) dimethyl. The mixture was stirred for two hours, and then allowed to cool to room temperature. The reaction solution was then poured into 12 liter of ethyl acetate with stirring. The solid matter thus precipitated was filtered off, and then dried. The yield was 189.5 g. The solid matter thus obtained exhibited a weight-average molecular weight (Mw) of 32,000 as determined by light scattering method.

Other such polymer compounds can be synthesized by the same method as mentioned above.

(Process for the Formation of Interlayer)

The interlayer may be provided by applying the foregoing polymer compound having an acidic group or having an acidic group as well as an onium group (hereinafter simply referred to as "polymer compound") to the foregoing aluminum support which has been rendered hydrophilic, and then optionally treated with an acidic aqueous solution (hereinafter simply referred to as "aluminum support") by various methods.

One of methods which can be normally used to provide the interlayer comprises dissolving the foregoing polymer compound in organic solvents such as methanol, ethanol and methyl ethyl ketone, singly or in admixture, or a mixture of these organic solvents and water, applying the solution thus obtained to an aluminum support, and then drying the coated material. Another method comprises dissolving the foregoing polymer compound in organic solvents such as methanol, methanol and methyl ethyl ketone, singly or in admixture, or a mixture of these organic solvents and water, dipping an aluminum support in the solution thus obtained so that the polymer compound is adsorbed by the aluminum support, washing the aluminum support with water or the like, and then drying the aluminum support. In accordance with the former method, a solution of polymer compound having a concentration of from 0.005 to 10% by weight can be applied to the aluminum support by various methods. For example, any method such as bar coater method, rotary coating method, spray coating method and curtain coating method may be used. In accordance with the latter method, the concentration of the solution to be applied is from 0.01 to 20% by weight, preferably from 0.05 to 5% by weight, the dipping temperature is from 20° C. to 90° C., preferably from 25° C. to 50° C., and the dipping time is from 0.1 seconds to 20 minutes, preferably from 2 seconds to 1 minute.

The foregoing polymer compound solution may be adjusted with a basic substance such as ammonia, triethylamine and potassium hydroxide, an inorganic acid such as hydrochloric acid, phosphoric acid, sulfuric acid and nitric acid, an organic acid substance such as organic sulfonic acid (e.g., nitrobenzenesulfonic acid, naphthalenesulfonic acid), organic phosphonic acid (e.g., phenylphosphonic acid) and organic carboxylic acid (e.g., benzoic acid, coumaric acid, malic acid), an organic acid chloride such as naphthalenesulfonyl chloride and benzenesulfonyl chloride or the like to a pH value of from 0 to 12, preferably from 0 to 5 before use. The foregoing polymer compound solution may further comprise a yellow dye incorporated therein to improve the tone reproducibility of the resulting photosensitive lithographic printing plate.

The coated amount of the polymer compound is preferably from 2 to 100 mg/m$^2$, more preferably from 5 to 50 mg/m$^2$ after dried. If the coated amount of the polymer compound falls below 2 mg/m$^2$, sufficient effect cannot be exerted. On the contrary, if the coated amount of the polymer compound exceeds 100 mg/m$^2$, the same disadvantage occurs.

<3> Positive-working Photosensitive Layer

As the positive-working photosensitive composition to be used in the formation of a positive-working photosensitive layer on the foregoing aluminum support obtained by treating an anodized aluminum substrate with an aqueous solution having a pH value of from 1.5 to 5, aluminum support obtained by treating an anodized aluminum substrate with an aqueous solution having a pH value of from 1.5 to 5, and then treating the aluminum support with a silicate of alkaline metal, aluminum support obtained by treating an anodized aluminum substrate with an aqueous solution having a pH value of from 1.5 to 5, treating the aluminum substrate with a silicate of alkaline metal, and then treating the aluminum substrate with an acidic aqueous solution, or aluminum support having an interlayer provided thereon there may be used any material which can change in its solubility in or swelling with the developer before and after exposure.

Representative positive-working photosensitive compositions will be described, but the present invention should not be construed as being limited thereto.

(Photosensitive Compound)

As the photosensitive compound to be incorporated in the photosensitive composition there may be used o-quinonediazide compound. A representative example of the o-quinonediazide compound is o-naphthoquinonediazide compound. Preferred examples of the o-naphthoquinonediazide compound employable herein include ester of 1,2-diazonaphthoquinonesulfonic acid chloride with pyrogallol-acetone resin described in JP-B-43-28403 (The term "JP-B" as used herein means an "examined Japanese patent application").

Other preferred examples of the o-quinonediazide compound employable herein include ester of 1,2-diazonaphthoquinonesulfonic acid chloride with phenol-formaldehyde resin described in U.S. Pat. Nos. 3,046,120 and 3,188,210.

Other useful examples of the O-naphthoquinonediazide compound include those reported and known in many patents, e.g., JP-A-47-5303, JP-A-48-63802, JP-A-48-63803, JP-A-48-96575, JP-A-49-38701, JP-A-48-13354, JP-B-37-18015, JP-B-41-11222, JP-B-45-9610, JP-B-49-17481, JP-A-5-11444, JP-A-5-19477, JP-A-5-19478, JP-A-5-107755, U.S. Pat. Nos. 2,797,213, 3,454,400, 3,544,323, 3,573,917, 3,674,496 and 3,785,825, British Patents 1,227, 602, 1,251,345, 1,267,005, 1,329,888 and 1,330,932, and German Patent 854,890.

Other examples of the o-quinonediazide compound employable herein include o-naphthoquinonediazide compound obtained by the reaction of polyhydroxy compound having a molecular weight of not more than 1,000 with 1,2-diazonaphthoquinonesulfonic acid chloride. Specific examples of the o-naphthoquinonediazide compound include those described in JP-A-51-139402, JP-A-58-150948, JP-A-58-203434, JP-A-59-165053, JP-A-60-121445, JP-A-60-134235, JP-A-60-163043, JP-A-61-118744, JP-A-62-10645, JP-A-62-10646, JP-A-62-153950, JP-A-62-178562, JP-A-64-76047, U.S. Pat. Nos. 3,102,809, 3,126,281, 3,130,047, 3,148,983, 3,184,310, 3,188,210 and 4,639,406.

In order to synthesize such an o-naphthoquinonediazide compound, the hydroxyl group in the polyhydroxy compound is reacted with 1,2-diazonaphthoquinonesulfonic acid chloride in an amount of from 0.2 to 1.2 equivalents, preferably from 0.3 to 1.0 equivalents. As 1,2-diazonaphthoquinonesulfonic acid chloride there may be preferably used 1,2-diazonaphthoquinone-5-sulfonic acid chloride. Alternatively, 1,2-diazonaphthoquinone-4-sulfonic acid chloride may be used. The resulting o-naphthoquinonediazide compound is a mixture of those having different positions and contents of 1,2-diazonaphthoquinonesulfonic acid ester group. The proportion of a compound having all hydroxyl groups converted to 1,2-diazonaphthoquinonesulfonic acid ester in the mixture (content of completely esterified compound) is preferably not less than 5 mol %, more preferably from 20 to 99 mol %.

As a photosensitive compound which works positively free from o-naphthoquinonediazide compound there may be used a polymer compound having o-nitrilecarbinolester group described in JP-B-52-2696, pyridinium group-containing compound described in JP-A-4-365049 or diazonium group-containing compound described in JP-A-5-249664, JP-A-6-83047, JP-A-6-324495 and JP-A-7-72621. Further, a combination of a compound which undergoes photodecomposition to produce an acid (as described in JP-A-4-121748 and JP-A-4-365043) and a compound having C—O—C group or C—O—Si group which dissociates when acted upon by an acid may be used. Examples of such a combination include a combination of a compound which undergoes photodecomposition to produce an acid and an acetal or O, N-acetal compound (as described in JP-A-48-89003), a combination of a compound which undergoes photodecomposition to produce an acid and an orthoester or amide acetal compound (as described in JP-A-51-120714) a combination of a compound which undergoes photodecomposition to produce an acid and a polymer having acetal or ketal group in its main chain (as described in JP-A-53-133429), a combination of a compound which undergoes photodecomposition to produce an acid and an enolether compound (as described in JP-A-55-12995, JP-A-4-19748 and JP-6-230574), a combination of a compound which undergoes photodecomposition to produce an acid and an N-acylimino carbon compound (as described in JP-A-55-126236), a combination of a compound which undergoes photodecomposition to produce an acid and a polymer having orthoester group in its main chain (as described in JP-A-56-17345), a combination of a compound which undergoes photodecomposition to produce an acid and a polymer having silylester group (as described in JP-A-56-10247), and a combination of a compound which undergoes photodecomposition to produce an acid and a silylether compound (as described in JP-A-60-37549, JP-A-60-121446, JP-A-63-236028, JP-A-63-236029 and JP-A-63-276046) The proportion of such a positive-working photosensitive compound (including the foregoing combinations) in the photosensitive composition is preferably from 10 to 50% by weight, more preferably from 15 to 40% by weight.

(Binder)

An o-quinonediazide compound can form a photosensitive layer by itself. However, an o-quinonediazide compound is preferably used in combination with an aqueous alkali-soluble resin which acts as a binder As such an aqueous alkali-soluble resin there may be used a novolak resin having such properties. Examples of such a novolak resin include cresol-formaldehyde resins such as phenol-formaldehyde resin, m-cresol-formaldehyde resin, p-cresol-formaldehyde resin, m-/p-mixed cresol-formaldehyde resin and phenol/cresol (m-, p-, o- or m-/p-/o-mixed) mixed formaldehyde. Such an alkali-soluble polymer compound preferably has a weight-average molecular weight of from 500 to 100,000.

Besides these resins, resol type phenol resins may be preferably used. A phenol/cresol (m-, p-, o- or m-/p-/o-mixed) mixed formaldehyde resin is preferred. In particular, phenol resins as described in JP-A-61-217034 are preferred.

Further examples of alkali-soluble resins which can be incorporated in the photosensitive layer include various alkali-soluble polymer compounds such as phenol-modified xylene resin, polyhydroxystyrene, polyhalogenated hydroxystyrene, acrylic resin having phenolic hydroxyl group as described in JP-A-51-34711, vinyl resin or urethane resin having sulfonamide group as described in JP-A-2-866, and vinyl resins having structural unit as described in JP-A-7-28244, JP-A-7-36184, JP-A-7-36185, JP-A-7-248628, JP-A-7-261394, and JP-A-7-333839 In particular, as vinyl resin there is preferably used a film-forming resin having at least one polymerizable component selected from the group consisting of the following alkali-soluble group-containing monomers (1) to (4)

(1) Acrylamides, methacrylamides, acrylic esters, methacrylic esters and hydroxystyrenes having aromatic hydroxyl group such as N-(4-hydroxyphenyl)acrylamide, N-(4-hydroxyphenyl)methacrylamide, o-hydroxystyrene, m-hydroxystyrene, o-hydroxystyrene, o-bromo-p-hydroxystyrene, m-bromo-p-hydroxystyrene, o-chloro-p-hydroxystyrene, m-chloro-p-hydroxystyrene, o-hydroxyphenyl acrylate, m-hydroxyphenyl acrylate, p-hydroxyphenyl acrylate, o-hydroxyphenyl methacrylate, m-hydroxyphenyl methacrylate and p-hydroxyphenyl methacrylate;

(2) Unsaturated carboxylic acids such as acrylic acid, methacrylic acid, maleic acid, maleic anhydride, half ester thereof, itaconic acid, itaconic anhydride and half ester thereof;

(3) Acrylamides such as N-(o-aminosulfonylphenyl) acrylamide, N-(m-aminosulfonylphenyl) acrylamide, N-(p-aminosulfonylphenyl)acrylamide, N-[1-(3-aminosulfonyl) naphthyl]acrylamide and N-(2-aminosulfonylethyl)arylamide, methacrylamides such as N-(o-aminosulfonylphenyl) methacrylamide, N-(m-aminosulfonylphenyl)methacrylamide, N-(p-aminosulfonylphenyl)methacrylamide, N-[1-(3-amino sulfonyl)naphthy]methacrylamide and N-(2-aminosulfonyl ethyl)methacrylamide, and unsaturated sulfonamides such as acrylic acid esters (e.g., o-aminosulfonylphenyl acrylate, m-aminosulfonylphenyl acrylate, p-aminosulfonylphenyl acrylate, 1-(3-aminosulfonylphenylnaphthyl)acrylate) and methacrylic acid esters (e.g., o-aminosulfonylphenyl methacrylate, m-aminosulfonylphenyl methacrylate, p-aminosulfonylphenyl methacrylate, 1-(3-aminosulfonylphenyl naphtyl)methacrylate); and (4) Phenylsulfonyl acrylamide which may have substituents, such as tosyl acrylamide and phenylsulfonyl methacrylamide which may have substituents, such as tosyl methacrylamide.

Further, film-forming resins obtained by copolymerizing the following monomers (5) to (14) besides these alkali-soluble group-containing monomers may be used.

(5) Acrylic acid esters and methacrylic acidesters having aliphatic hydroxyl group, such as 2-hydroxyethyl acrylate and 2-hydroxyethyl methacrylate;

(6) (Substituted) acrylic acid esters such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate;

(7) (Substituted) methacrylic acid esters such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate and N-dimethylaminoethyl methacrylate;

(8) Acrylamides or methacrylamides such as acrylamide, methacrylamide, N-methylolacrylamide, N-methylol methacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide;

(9) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(10) Vinyl esters such as vinyl acetate, vinyl chloroacetate, vinyl butyrate and vinyl benzoate;

(11) Styrenes such as styrene, a-methylstyrene, methylstyrene and chloromethylstyrene;

(12) Vinyl ketones such as methyl vinyl ketone, ethyl vinyl ketone, propyl vinyl ketone and phenyl vinyl ketone;

(13) Olefins such as ethylene, propylene, isobutylene, butadiene and isoprene; and

(14) N-vinylpyrrolidone, N-vinylcarbazole, 4-vinylpyridine, acrylonitrile, methacrylonitrile, etc.

These alkali-soluble polymer compounds each preferably have a weight-average molecular weight of from 500 to 500,000.

These alkali-soluble polymer compounds may be used singly or in combination. The proportion of such a polymer compound in the photosensitive composition is preferably not more than 80% by weight, more preferably from 30 to 80% by weight, even more preferably from 50 to 70% by weight. This range is advantageous in developability and press life.

Further, as described in U.S. Pat. No. 4,123,279, the foregoing alkali-soluble polymer compound is preferably used in combination with a condensate of a phenol having a $C_{3-8}$ alkyl group as a substituent with formaldehyde such as t-butylphenol-formaldehyde resin and octylphenol-formaldehyde resin or o-naphthoquinonediazidesulfonic acid ester thereof (as described in JP-A-61-243446) from the standpoint of improvement of image ink-receptivity.

(Development Accelerator)

The photosensitive composition preferably comprises cyclic acid anhydrides, phenols and organic acids incorporated therein to enhance the sensitivity thereof and improve the developability thereof.

As the cyclic acid anhydrides there may be used phthalic anhydride, tetrahydrophthalic anhyride, hexahydroxphthalic anhydride, 3,6-endoxy-$\Delta^4$-tetrahydrophthalic anhydride, tetrachlorophthalic anhydride, maleic anhydride, chloromaleic anhyride, α-phenylmaleic anhydride, succinic anhydride and pyromellitic anhydride as disclosed in U.S. Pat. No. 4,115,128.

Examples of the phenols employable herein include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxy-triphenylmethane, and 4,4', 3",4"-tetrahydroxy-3,5,3',5'-tetramethyltriphenyl methane.

Examples of the organic acids employable herein include sulfonic acids, sulfinic acids, alkylsulfuric acids, phosphonic acids, phosphonic acid esters, and carboxylic acids as disclosed in JP-A-60-88942 and JP-A-2-96755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 1,4-cyclohexene-2,2-dicarboxylic acid, erucic acid, lauric acid, n-undecanoic acid, and ascorbic acid.

The proportion of the foregoing cyclic acid anhydrides, phenols and organic acids in the photosensitive composition is preferably from 0.05 to 15% by weight, more preferably from 0.1 to 5% by weight.

(Development Stabilizer)

The photosensitive composition may further comprise a nonionic surface active agent as disclosed in JP-A-62-251740 and JP-A-4-68355 or an amphoteric surface active agent as disclosed in JP-A-59-121044 and JP-A-4-13149 incorporated therein to enhance the processing stability to development conditions (so-called development latitude).

Specific examples of the nonionic surface active agent employable herein include sorbitan tristearate, sorbitan monopalmitate, sorbitan trioleate, monoglyceride stearate, polyoxyethylene sorbitan monoleate, and polyoxyethylene nonyl phenyl ether.

Specific examples of the amphoteric surface active agent employable herein include alkyl di(aminoethyl)glycine, alkyl polyaminoethylglycine hydrochloride, 2-alkyl-N-carboxyethyl-N-hydroxyethylimidazolinium betaine, N-tetradecyl-N,N-betaine type surface active agent (e.g., AMOGEN K, produced by Dai-ichi Kogyo Seiyaku Co., Ltd.), and alkylimidazoline type surface active agent (e.g., Lebon 15, produced by SANYO CHEMICAL INDUSTRIES, LTD.).

The proportion of the foregoing nonionic surface active agent and amphoteric surface active agent in the photosensitive composition is preferably from 0.05 to 15% by weight, more preferably from 0.1 to 5% by weight.

(Printing-out Agent, Dye, Others)

The photosensitive composition may comprise a printing-out agent for obtaining a visible image shortly after exposure, a dye as an image colorant, and other fillers. Examples of the dye employable herein include basic dyes comprising a salt of cation having a basic dye skeleton described in JP-A-5-313359 with an organic anion with 10 or more carbon atoms having a sulfonic acid group as only exchangeable group and from 1 to 3 hydroxyl groups. The amount of the dye to be incorporated is from 0.2 to 5% by weight based on the total weight of the photosensitive composition.

The photosensitive composition may further comprise a compound which interacts with a dye to produce a photo-decomposition product that changes color tone as described in the above cited JP-A-5-313359. Specific examples of such a compound include o-naphthoquinonediazide-4-sulfonic acid halogenide as disclosed in JP-A-50-36209 (corresponding to U.S. Pat. No. 3,969,118), trihalomethyl-2-pyrone or trihalomethyl tricidine, various o-naphthoquinonediazide compounds as disclosed in JP-A-55-62444 (corresponding to U.S. Pat. No. 2,038,801), and 2-trihalomethyl-5-aryl-1,3,4-oxadiazole compound as disclosed in JP-A-55-77742 (corresponding to U.S. Pat. No. 4,279,982). These compounds may be used singly or in admixture. Among these compounds, those having absorption at 400 nm may be used as the foregoing yellow dye.

As the image colorants there may be used dyes other than those disclosed in the above cited JP-A-5-313359. Preferred examples of dyes including salt-forming organic dyes include oil-soluble dyes and basic dyes. Specific examples of these dyes include Oil Green BG, Oil Blue BOS and Oil Blue #603 (produced by Oriental Chemical Industries, Ltd.), Victoria Pure Blue BOH, Victoria Pure Blue NAPS and Ethyl Violet 6HNAPS (produced by Hodogaya Chemical Co., Ltd.), Rhodamine B (C145170B), Malachite Green (C142000) and Methylene Blue (C152015).

The photosensitive composition may further comprise a yellow dye represented by the following general formula [I], [II] or [III] having an absorbance at 417 nm of not less than 70% of that at 436 nm.

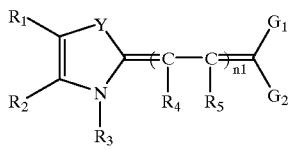

[I]

In the general formula [I], $R_1$ and $R_2$ each independently represent a hydrogen atom or a $C_{1-10}$ alkyl, aryl or alkenyl group. $R_1$ and $R_2$ may together form a ring. $R_3$, $R_4$ and $R_5$ each independently represent a hydrogen atom or a $C_{1-10}$ alkyl group. $G_1$ and $G_2$ each independently represent an alkoxycarbonyl group, an aryloxycarbonyl group, an acyl group, an arylcarbonyl group, an alkylthio group, an arylthio group, an alkylsulfonyl group, an arylsulfonyl group or a fluoroalkylsulfonyl group. $G_1$ and $G_2$ may together form a ring. One or more of $R_1$, $R_2$, $R_3$, $R_4$, $R_5$, $G_1$, and $G_2$ have one or more sulfonic acid groups, carboxyl groups, sulfonamide groups, imide groups, N-sulfonylamide groups, phenolic hydroxyl groups, sulfonimide groups or metal salts thereof or inorganic or organic ammonium salts thereof. Y represents a divalent atomic group selected from the group consisting of O, S, NR (in which R represents a hydrogen atom or an alkyl or aryl group), Se, —C(CH₃)₂—and —CH═CH—. The suffix n1 represents an integer of 0 or

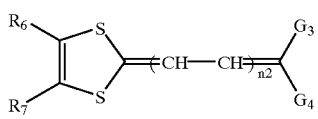

[II]

In the general formula [II], $R_6$ and $R_7$ each independently represent a hydrogen atom, an alkyl group, a substituted alkyl group, an aryl group, a substituted aryl group, a heterocyclic group, a substituted heterocyclic group, an allyl group or a substituted allyl group. $R_6$ and $R_7$ may together form a ring with the carbon atom to which it is bonded. The suffix $n_2$ represents an integer of 0 to 2. $G_3$ and $G_4$ each independently represent a hydrogen atom, a cyano group, an alkoxycarbonyl group, a substituted alkoxycarbonyl group, an aryloxycarbonyl group, a substituted aryloxycarbonyl group, an acyl group, a substituted acyl group, an arylcarbonyl group, a substituted arylcarbonyl group, an alkylthio group, an arylthio group, an alkylsulfonyl group, an arylsulfonyl group or a fluoroalkylsulfonyl group, with the proviso that $G_3$ and $G_4$ are not a hydrogen atom at the same time. $G_3$ and $G_4$ may together form a ring comprising nonmetallic atoms with the carbon atom to which it is bonded.

One or more of $R_6$, $R_7$, $G_3$, and $G_4$ have one or more sulfonic acid groups, carboxyl groups, sulfonamide groups, imide groups, N-sulfonylamide groups, phenolic hydroxyl groups, sulfonimide groups or metal salts thereof or inorganic or organic ammonium salts thereof.

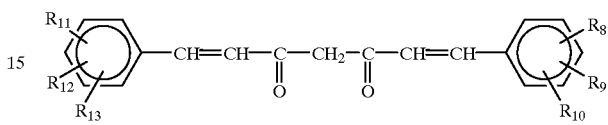

[III]

In the general formula [III], $R_8$, $R_9$, $R_{10}$, $R_{11}$, $R_{12}$ and $R_{13}$ may be the same or different and each represent a hydrogen atom, an alkyl group, a substituted alkyl group, an aryl group, a substituted aryl group, an alkoxy group, a hydroxyl group, an acyl group, a cyano group, an alkoxycarbonyl group, an aryloxycarbonyl group, a nitro group, a carboxyl group, a chloro group or a bromo group. (Formation of positive-working photosensitive layer, others)

The positive-working photosensitive layer can be obtained by dissolving the foregoing various components of photosensitive composition in a proper solvent, and then applying the solution to a support.

Examples of the solvent employable herein include γ-butyrolactone, ethylene dichloride, cyclohexane, methyl ethyl ketone, ethylene glycol monomethyl ether, ethylene glycol monoethyl ether, 2-methoxyethyl acetate, 1-methoxy-2-propanol, 1-methoxy-2-propyl acetate, toluene, ethyl acetate, methyl lactate, ethyl lactate, dimethylsulfoxide, dimethylacetamide, dimethylformamide, water, N-methylpyrrolidone, tetrahydrofurfuryl alcohol, acetone, diacetone alcohol, methanol, ethanol, isopropanol, and diethylene glycol dimethyl ether. These solvents may be used singly or in admixture. The concentration (solid content) of the photosensitive composition in the solution is preferably from 2 to 50% by weight. The coated amount of the coating solution is preferably from 0.5 g/m² to 4.0 g/m². If the coated amount of the coating solution falls below 0.5 g/m², the resulting press life is shortened. On the contrary, if the coated amount of the coating solution exceeds 4.0 g/m², the resulting press life is prolonged, but the resulting sensitivity is lowered.

The formation of the photosensitive layer by, e.g., applying the photosensitive composition solution to the support can be accomplished by any of various known methods.

The photosensitive composition may comprise a surface active agent for facilitating coating such as fluorine-based surface active agent described in JP-A-62-170950 incorporated therein. The amount of such a surface active agent to be incorporated is preferably from 0.01 to 1% by weight, more preferably from 0.05 to 0.5% by weight based on the total weight of the photosensitive composition. The lithographic printing plate thus obtained can provide a printed matter faithful to the original film but with much blur and roughness. In order to eliminate blur, the surface of the photosensitive layer thus provided can be roughened. For example, as described in JP-A-61-258255, particles having a size of several micrometers may be added to the photosensitive composition solution which is then applied to the support. However, this method can exert little effect of eliminating blur and cannot eliminate roughness.

On the other hand, the use of a method involving the attachment of a roughening component to the surface of the photosensitive layer as described in JP-A-50-125805, JP-B-57-6582, JP-B-61-28986 and JP-B-62-62337 makes it possible to eliminate blur and further eliminate roughness. Further, as described in JP-B-55-30619, the incorporation of a light absorbing agent having absorption in the wavelength range to which the photosensitive material is sensitive in the matt layer makes it possible to further eliminate blur and roughness. Even if an original film comprising 300 or more lines per inch which is more liable to blur and roughness in print than original film comprising 175 lines per inch or an original film obtained by FM screening is used, this method can provide a good printed matter. As mentioned above, the photosensitive layer on the photosensitive printing precursor preferably has the following minute pattern. In other words, the height of the coated portion is preferably from 1 to 40 $\mu$m, particularly from 2 to 20 $\mu$m. The size (width) of the coated portion is preferably from 10 to 10,000 $\mu$m, particularly from 20 to 200 $\mu$m. The amount of the coated portion is from 1 to 1,000 pieces/mm$^2$, preferably from 5 to 500 pieces/mm$^2$.

<3> Development

The development of the positive-working photosensitive lithographic printing plate of the present invention will be further described hereinafter.

(Exposure)

The positive-working photosensitive lithographic printing plate of the present invention is imagewise exposed to light, and then subjected to development. As the source of activation light for use in imagewise exposure include carbon arc lamp, mercury vapor lamp, metal halide lamp, xenon lamp, tungsten lamp, and chemical lamp. Examples of radiation employable herein include electron rays, X rays, ion beam, and far infrared rays. Further, g-ray, i-ray, deep ultraviolet rays, or high density energy beam (laser beam) may be used. Examples of laser beam employable herein include helium neon laser, argon laser, krypton laser, helium cadmium laser, KrF exima laser, semiconductor laser, and YAG laser.

(Developer)

As the developer for the positive-working photosensitive lithographic printing plate of the present invention there may be preferably used an alkaline aqueous solution substantially free of organic solvent. Specific preferred examples of such an alkaline aqueous solution include aqueous solution of sodium silicate, potassium silicate, NaOH, KOH, LiOH, tribasic sodium phosphate, dibasic sodium phosphate, tribasic ammonium phosphate, dibasic ammonium phosphate, sodium metasilicate, sodium carbonate, sodium bicarbonate, potassium carbonate, and aqueous ammonia. More preferably, a developer with a pH value of from 9.0 to 13.5 containing (a) at least one saccharide selected from nonreducing sugars and (b) at least one base is used.

The foregoing developer will be further described hereinafter. The term "developer" as used herein is meant to indicate development initiator (developer in a narrow sense) and developer replenisher unless otherwise specified.

(Nonreducing Sugar and Base)

This developer comprises as main components at least one compound selected from the group consisting of nonreducing sugars and at least one base and exhibits a pH value of from 9.0 to 13.5.

These nonreducing sugars are sugars having no free aldehyde or ketone groups and showing no reducing properties and can be divided into three groups, i.e., trehalose type oligosaccharide comprising reducing groups connected to each other, glycoside comprising reducing group in saccharide connected to nonsaccharide and sugaralcohol obtained by hydrogenating and reducing saccharide. Any of these nonreducing sugars may be preferably used. Examples of the trehalose type oligosaccharide include saccharose and trehalose. Examples of the glycoside include alkylglycoside, phenolglycoside, and mustard oil glycoside. Examples of the sufaralcohol include D,L-arabitol, ribite, xylite, D,L-sorbitol, D,L-mannitole, D,L-iditol, D,L-talitol, dulcitol, and allozulcitol. Further, maltitol obtained by hydrogenating disaccharide and reduced material (reduced syrup) obtained by hydrogenating oliosaccharide are preferably used. Particularly preferred among these nonreducing sugars are sugaralcohol and saccharose. In particular, D-sorbitol, saccharose, and reduced syrup are desirable because they exhibit a buffering action in a proper pH range and are inexpensive.

These nonreducing saccharides may be used singly or in combination. The proportion of such a nonreducing saccharide in the developer is preferably from 0.1 to 30% by weight, more preferably from 1 to 20% by weight. If the proportion of such a nonreducing saccharide falls below the above defined range, a sufficient buffering action cannot be obtained. On the contrary, if the proportion of such a nonreducing saccharide exceeds the above defined range, the resulting developer can hardly be highly concentrated. In addition, it adds to the cost.

If a reducing saccharide and a base are used in combination, the resulting developer changes in its color to brown with time and decreases in its pH value gradually, lowering in its developability.

As the base to be used in combination with the nonreducing saccharide there may be used an alkali agent which has heretofore been known. For example, inorganic alkali agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate may be used. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene-imine, ethylenediamine and pyridine may be used.

These alkali agents may be used singly or in combination. Preferred among these alkali agents are sodium hydroxide and potassium hydroxide. This is because the adjustment of the amount of such an alkali agent based on the nonreducing sugar makes it possible to adjust the pH value of the developer within a wide range. Further, trisodium phosphate, tripotassium phosphate, sodium carbonate, potassium carbonate, etc. are desirable because they have a buffering action themselves.

Such an alkali agent is added in such an amount that the pH value of the developer falls within the range of from 9.0 to 13.5. The amount of the alkali agent to be added is determined by the desired pH value of the developer and the kind and amount of the nonreducing sugar used. More preferably, the pH value of the developer falls within the range of from 10.0 to 13.2.

The developer may further comprise an alkaline buffer solution comprising a weak acid and a strong base incorporated therein besides the foregoing saccharides. The weak acid to be used as such a buffer solution preferably has a pKa value of from 10.0 to 13.2. Such a weak acid may be selected from the group consisting of those described in *IONISATION CONSTANTS OF ORGANIC ACIDS IN AQUEOUS SOLUTION*, Pergamon Press, e.g., alcohols such as 2,2,3,3-tetrafluoropropanol-1 (pKa: 12.74), trifluoroethanol (pKa: 12.37) and trichloroethanol (pKa: 12.24), aldehydes such as pyridine-2-aldehyde (pKa: 12.68) and pyridine-4-aldehyde (pKa: 12.05), compounds having phenolichydroxyl group such as salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfonic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34), o-cresol (pKa: 10.33), resorcinol (pKa: 11.27), p-cresol (pKa: 10.27) and m-cresol (pKa: 10.09), oxims such as 2-butanonoxim (pKa: 12.45), acetoxim (pKa: 12.42), 1,2-cycloheptanedionedioxim (pKa: 12.3), 2-hydroxybenzaldehydoxim (pKa: 12.10), dimethyl glyoxim (pKa: 11.9), ethanediamidedioxim (pKa: 11.37) and acetophenonoxim (pKa: 11.35), nucleic acid-related substances such as adenosine (pKa: 12.56), inosine (pKa: 12.5), guanine (pKa: 12.3), cytosine (pKa: 12.2), hypoxanthine (pKa: 12.1) and xanthine (pKa: 11.9), and weak acids such as diethylaminomethylphosphonic acid (pKa: 12.32), 1-amino-3,3,3-trifluorobenzoicacid (pKa: 12.29), isopropylidenediphosphonic acid (pKa: 12.10), 1,1-ethylidenediphosphonic acid (pKa: 11.54), 1,1-ethylidenediphosphonic acid-1-hydroxy (pKa: 11.52), benzimidazole (pKa: 12.86), thiobenzamide (pKa: 12.8), picolinethioamide (pKa: 12 55) and barbituric acid (pKa: 12.5).

Preferred among these weak acids are sulfosalicylic acid and salicylic acid.

Preferred examples of the base to be used in combination with such a weak acid include sodium hydroxide, ammonium hydroxide, potassium hydroxide and lithium hydroxide.

These alkali agents may be used singly or in combination.

The foregoing various alkali agents may be adjusted to a preferred range of pH by their concentration and combination before use.

(Surface Active Agent)

The developer of the present invention may comprise various surface active agents or organic solvents incorporated therein for the purpose of enhancing accelerating the developing properties thereof, dispersing development tailings and enhancing the ink-receptivity of the image area on the printing plate as necessary. Preferred examples of these surface active agents or organic solvents include anionic surface active agents, cationic surface active agents, and nonionic surface active agents.

Preferred examples of these surface active agents include nonionic surface active agents such as polyoxyethylene alkyl ether, polyoxyethylene alkyl phenyl ether, polyoxyethylene polystyryl phenyl ether, polyoxyethylene polyoxypropylene alkyl ether, glycerinaliphatic acid partial ester, sorbitanaliphatic partial ester, pentaerythritolaliphatic acid partial ester, propyleneglycolmonoaliphatic acid ester, sucrose aliphatic acid partial ester, polyoxyethylenesorbitanaliphatic acid partial ester, polyoxyethylenesorbitolaliphatic acid partial ester, polyoxyethylated castor oil, polyoxyethyleneglycerinalphatic acid partial ester, aliphatic acid diethanolamide, N,N-bis-2-hydroxyalkylamine, polyoxyethylene alkylamine. triethanolaminealiphatic acid ester and trialkylamine oxide, anionic surface active agents such as aliphatic acid salt, abietate, hydroxyalkanesulfonic acid salt, alkanesulfonic acid salt, dialkylsulfosuccinic acid salt, straight-chain alkylbenzenesulfonic acid salt, branched alkylbenzenesulfonic acid salt, alkylnaphthalenesulfonic acid salt, alkylphenoxypolyoxyethylenepropylsulfonic acid, polyoxyethylenealkylsulfophenylether salt, N-methyl-N-oleyltauric sodium salt, N-alkylsulfosuccinic acid monoamide disodium salt, petroleumsulfonic acid salt, sufated beef tallow, sulfuric acid ester of aliphatic acid alkylester, alkylsulfuric acid ester, polyoxyethylenealkylethersulfuric acid ester, sulfuric acid ester of aliphatic acid monoglyceride, polyoxyethylenealkylphenylethersulfuric acid ester, polyoxyethylenestyrylphenylethersulfuric acid ester, alkylphosphoric acid ester, polyoxyethylenealkylether phosphoric acid ester, polyoxyethylenealkylphenylether phosphoric ester, partial saponification product of styrene/maleic anhydride copolymer, partial saponification product of olefin/maleic anhydride copolymer and naphthalenesulfonic acid-formalin condensate, cationic surface active agents such as alkylamine, quaternary ammonium salt (e.g., tetrabutylammonium bromide), polyoxyethylenealkylamine salt and polyethylenepolyamine derivative, and amphoteric surface active agents such as carboxybetaine, aminocarboxylic acid, sulfobetaine, aminosulfuric acid ester and imidazoline. Among these surface active agents, the term "polyoxyethylene" may be replaced by polyoxyalkylene such as polyoxymethylene, polyoxypropylene and polyoxybutylene which may be used herein as well.

An even more desirable surface active agent is a fluorine-based surface active agent having perfluoroalkyl group in its molecule. Examples of such a fluoro-based surface active agent include anionic fluorine-based surface active agents such as perfluoroalkylcarboxylic acid salt, perfluoroalkylsulfonic acid salt and pertluoroalkylphosphoric acid ester, amphoteric surface active agents such as perfluoroalkylbetaine, cationic surface active agents such as perfluoroalkyltrimethyl ammonium salt, and nonionic surface active agents such as perfluoroalkylamine oxide, perfluoroalkylethylene oxide adduct, perfluoroalkyl group- and hydrophilic group-containing oligomer, perfluoroalkyl group- and lipophilic group-containing oligomer, perfluoroalkyl group-, hydrophilic group- and lipophilic group-containing oligomer and perfluoroalkyl group- and lipophilic group-containing urethane.

The foregoing surface active agents may be used singly or in combination. The foregoing surface active agents may be incorporated in the developer in an amount of from 0.001 to 10% by weight, preferably from 0.01 to 5% by weight.

(Development Stabilizer)

The developer of the present invention may comprise various development stabilizers incorporated therein. Preferred examples of these development stabilizers include polyethylene glycol adduct of sugaralcohol, tetraalkylammonium salt such as tetrabutylammonium hydroxide, phosphonium salt such as tetrabutylphosphonium bromide and iodonium salt such as diphenyliodonium chloride as described JP-A-6-282079.

Further examples of these development stabilizers include anionic surface active agents and amphoteric surface active agents as described in JP-A-50-51324, water-soluble cationic polymers as described in JP-A-55-95946, and water-soluble amphoteric polymer electrolytes as described in JP-A-56-142528.

Still further examples of the development stabilizers include alkylene glycol-added organic boron compounds as described in JP-A-59-84241, polyoxyethylene-polyoxypropylene block polymerization type water-soluble surface active agents as described in JP-A-60-111246, polyoxyethylene-polyoxypropylene-substituted alkylenediamine compounds as described in JP-A-60-129750, polyethylene glycols having a weight-average molecular weight of not less than 300 as described in JP-A-61-215554, fluorine-containing surface active agents having cationic group as described in JP-A-63-175858, and water-soluble ethylene oxide adducts obtained by adding 4 or more mols of ethylene oxides to acid or alcohol and water-soluble polyalkylene compounds as described in JP-A-2-39157.

(Organic Solvent)

The developer of the present invention is substantially free of organic solvent but may comprise an organic solvent incorporated therein as necessary. As such an organic solvent there is preferably used one having a water solubility of about 10% by weight or less, preferably not less than 5% by weight. Examples of such an organic solvent include 1-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzylalcohol, m-methoxybenzylalcohol, p-methoxybenzylalcohol, benzylalcohol, cyclohexanol, 2-methylcyclohexanol, 3-methylcyclohexanol, 4-methyl cyclohexanol, N-phenylethanolamine, and N-phenyldiethanol amine. The term "developer substantially free of organic solvent" as used herein is meant to indicate a developer containing an organic solvent in an amount of not more than 5% by weight based on the total weight thereof. The amount of the organic solvent to be used is closely related to the amount of the surface active agent to be used. It is preferred that the amount of the surface active agent to be used increases as the amount of the organic solvent increases. This is because if an organic solvent is used in a large amount while a surface active agent is used in a small amount, the organic solvent cannot be completely dissolved in the developer, making it impossible to expect assured good developing properties.

(Reducing Agent)

The developer of the present invention may further comprise a reducing agent incorporated therein. This reducing agent acts to inhibit stain on the printing plate. This reducing agent is particularly effective for the development. of a negative-working photosensitive lithographic printing plate comprising a photosensitive diazonium salt compound. Preferred examples of organic reducing agent include phenol compounds such as thiosalicylic acid, hydroquinone, methol, methoxyquinone, resorcine and 2-methylresorcine, and amine compounds such as phenylenediamine and phenylhydrazine. Preferred examples of inorganic reducing agent include salts of inorganic acids such as sulfurous acid, hydrogensulfurous acid, phosphorous acid, hydrogenphosphorous acid, dibasic hydrogenphosphorous acid, thiosulfuric acid and dithionous acid with sodium, potassium and ammonium. Among these reducing agents, sulfites are particularly excellent in the effect of inhibiting stain. Such a reducing agent is preferably incorporated in the developer during use in an amount of from 0.05 to 5% by weight.

(Organic Carboxylic Acid)

The developer of the present invention may further comprise an organic carboxylic acid incorporated therein. As such an organic carboxylic acid there may be used a $C_{6-20}$ aliphatic carboxylic acid or aromatic carboxylic acid. Specific examples of the aliphatic carboxylic acid include caproic acid, enanthylic acid, caprylic acid, lauric acid, myristic acid, palmitic acid, and stearic acid. A particularly preferred example of the aliphatic carboxylic acid is a $C_{8-12}$ alkanic acid. Alternatively, an unsaturated aliphatic acid having a double bond in carbon chain or branched carbon chain aliphatic carboxylic acid may be used.

As the aromatic carboxylic acid there may be used a compound comprising carboxyl group substituted on benzene ring, naphthalene ring, anthracene ring, etc. Specific examples of such a compound include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, 1-hydroxy-2-naphtoic acid, 3-hydroxy-2-naphthoic acid, 2-hydroxy-1-naphtoic acid, and 2-naphthoic acid. Particularly effective among these compounds is hydroxynaphthoic acid.

The foregoing aliphatic or aromatic carboxylic acid is preferably used in the form of sodium salt, potassium salt or ammonium salt to enhance its water solubility. The content of the organic carboxylic acid in the developer is not specifically limited. However, if the content of the organic carboxylic acid falls below 0.1% by weight, the resulting effect is not sufficient. On the contrary, if the content of the organic carboxylic acid exceeds 10% by weight, the resulting effect can no longer be enhanced. Further, the organic carboxylic acid can prevent the dissolution of other additives, if any. Accordingly, the amount of the organic carboxylic acid to be added is preferably from 0.1 to 10% by weight, more preferably from 0.5 to 4% by weight based on the weight of the developer.

(Others)

The developer of the present invention may further comprise a preservative, a coloring agent, a thickening agent, an anti-foaming agent, a hard water softener, etc. incorporated therein as necessary. Examples of such a hard water softener include polyphosphoric acid, sodium salt, potassium and ammonium salts thereof, aminopolycarboxylic acid such as ethylenediaminetetraacetic acid, diethylenetriamine pentaacetic acid, triethylenetetraminehexaacetic acid, hydroxyethylethylenediaminetriacetic acid, nitrilotriacetic acid, 1,2-diaminocyclohexanetetraacetic acid and 1,3-diamino-2-propanoltetraacetic acid, sodium, potassium and ammonium salts thereof, aminotri (methylenephosphonic acid), ethylenediaminetetra(methylenephosphonic acid), diethylene triaminepenta(methylenephosphonic acid), triethylene tetraminehexa (methylenephosphonic acid), hydroxyethyl ethylenediaminetri (methylenephosphonic acid), 1-hydroxyethane-1,1-diphosphonic acid, and sodium, potassium and ammonium salts thereof.

The optimum amount of such a hard water softener to be used varies with its chelating power and the hardness and amount of water used. In practice, however, the amount of the water softer to be used is normally from 0.01 to 5% by weight, preferably from 0.01 to 0.5% by weight based on the weight of the developer used. If the amount of the water softer to be used falls below the above defined range, the desired object cannot be fully accomplished. On the contrary, if the amount of the water softer to be used exceeds the above defined range, the image area suffers from defects such as white mark.

The balance of the developer is water. The developer is stored in the form of concentrated solution having a less water content than in use so that it can be diluted before use. This is advantageous in portability. The optimum concentration of the developer is such that the various components of the developer undergo neither separation nor precipitation.

As the developer for the photosensitive lithographic printing plate there may be used a developer as described in JP-A-6-282079. This developer contains a water-soluble ethylene oxide adduct obtained by adding not less than 5 mols of ethylene oxide to a silicate of alkaline metal having an $SiO_2/M_2O$ (M represents an alkaline metal) molar ratio of from 0.5 to 2.0 and a sugaralcohol having not less than 4 hydroxyl groups. The sugaralcohol is a polyhydric alcohol corresponding to one obtained by reducing the aldehyde group and ketone group to primary alcohol and secondary alcohol, respectively. Specific examples of the sugaralcohol include D,L-threitol, erythritol, D,L-arabitol, ribite, xylite, D,L-sorbitol, D,L-mannitole, D,L-iditol, D,L-talitol, dulcitol, and allozulcitol. Further examples of the sugaralcohol include diglycerin, triglycerin, tetraglycerin, pentaglycerin and hexaglycerin obtained by condensing sugaralcohols. The foregoing water-soluble ethylene oxide adduct can be obtained by adding not less than 5 mols of ethylene oxide to 1 mol of the foregoing sugaralcohol. If necessary, the ethylene oxide adduct may be block-copolymerized with a propylene oxide to an extent such that its solubility tolerates. These ethylene oxide adducts may be used singly or in combination.

The amount of the foregoing water-soluble ethylene oxide adduct to be added is preferably from 0.001 to 5% by weight, more preferably from 0.001 to 2% by weight based on the weight of the developer used.

This developer may further comprise the foregoing various surface active agents or organic solvents incorporated therein for the purpose of accelerating the development, dispersing development tailings and enhancing the ink-receptivity of the image area on the printing plate as necessary.

(Development and Post-treatment)

The photosensitive lithographic printing plate which has been developed with a developer having such a composition is then subjected to post-treatment with wash water, a rinsing solution containing a surface active agent or the like, a finisher containing gum arabic, a starch derivative or the like as main components or a protective gum solution. These post-treatments may be used in various combinations.

In recent years, an automatic developing machine for photosensitive lithographic printing plate has found wide application in the plate-making and printing industry from the standpoint of rationalization and standardization of plate-making procedure. This automatic developing machine generally comprises a development zone and a post-treatment zone. In some detail, this automatic developing machine comprises an apparatus for conveying a photosensitive lithographic printing plate, various processing tanks and a spraying apparatus. In operation, the photosensitive lithographic printing plate which has been exposed to light is sprayed with various processing solutions which has been pumped and jetted through a spray nozzle for development and post-treatment while being horizontally conveyed. In recent years, there have also been known a process which comprises conveying a photosensitive lithographic printing plate through a processing tank filled with a processing solution so that it is subjected to development and a process which comprises supplying a small constant amount of wash water onto the surface of a printing plate which has been subjected to development so that the resulting waste water can be used as a diluting water for the stock solution of developer.

During the foregoing automatic processing, the various processing solutions may be replenished with the respective replenisher depending on the amount of the printing plate to be processed, the operating time, etc. Alternatively, a so-called throwaway processing process involving the processing with a substantially fresh processing solution may be used.

The lithographic printing plate thus obtained is then mounted on an offset printing machine for the printing of a large number of sheets.

The photosensitive composition of the present invention which is used as a negative-working photosensitive layer for photopolymerizable printing plate will be described hereinafter.

The photosensitive composition of the present invention which is a photopolymerizable photosensitive composition is mainly composed of the foregoing fluorine-based polymer as well as a compound having addition-polymerizable ethylenically double bonds and a photopolymerization initiator and optionally a thermal polymerization inhibitor.

The foregoing compound having addition-polymerizable double bonds can be arbitrarily selected from the group consisting of compounds having one, preferably two or more ethylene-terminated unsaturated bonds.

Such a compound may be in a chemical form such as monomer, prepolymer, i.e., dimer, trimer, oligomer, mixture and copolymer thereof.

Examples of these monomers and copolymers thereof include ester of unsaturated carboxylic acid (e.g., acrylic acid, methacrylic acid, itaconic acid, crotonic acid, isocrotonic acid, maleic acid) with aliphatic polyhydric alcohol compound, and amide of unsaturated carboxylic acid with aliphatic amine compound.

Specific examples of the ester of aliphatic polyhydric alcohol compound with unsaturated carboxylic acid include acylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylol propane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, soritol hexaacrylate, tri (acryolyloxyethyl) isocyanurate and polyester acrylate oligomer, methacrylic acid esters such as tetramethylene glycol dimethacrylate, triethylene glycol dimethacrylate, neopentyl glycol dimethacrylate, trimethylol propane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy) phenyl]dimethylmethane and bis-[p-methacryloxyethoxy)phenyl] dimethylmethane, itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate, crotonic acid esters such as ethylene glycol dicrotonate, tetramethylene glycol dicrotonate, pentaerythritol dicrotonate and sorbitol tetradicrotonate, isocrotonic acid esters such as ethylene glycol diisocrotonate, pentaerythritol diisocrotonate and sorbitol tetraisocrotonate, and maleic acid esters such as ethylene glycol dimalate, triethylene glycol dimalate, pentaerythritol dimalate and sorbitol tetramalate.

A mixture of the foregoing ester monomers may be used.

Specific examples of the amide of aliphatic polyvalent amine compound with unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

A further example of the amide of aliphatic polyvalent amine compound with unsaturated carboxylic acid is a vinylurethane compound having two or more polymerizable vinyl groups per molecule obtained by adding a vinyl monomer having a hydroxyl group represented by the following general formula (A) to a polyisocyanate compound having two or more isocyanate groups per molecule as described in JP-B-48-41708.

$$CH_2=C(R_5)COOCH_2CH(R_6)OH \qquad (A)$$

wherein $R_5$ and $R_6$ each represent H or $CH_3$.

Further examples of the amide of aliphatic polyvalent amine compound with unsaturated carboxylic acid include polyfunctional acrylates or methacrylates such as urethane acrylates as described in JP-A-51-37193, polyester acrylates as described in JP-A-48-64183, JP-B-49-43191 and JP-B-52-30490 and epoxy acrylates obtained by the reaction of epoxy resin with (meth)acrylic acid. Further, compounds cited as photosetting monomer and oligomer in *Journal of The Adhesion Society of Japan*, vol. 20, No. 7, pp. 300–308, 1984 may be used. The amount of the compound to be used is from 5 to 70% by weight (hereinafter abbreviated as "%"), preferably from 10 to 50% based on the total weight of the components.

As the photopolymerization initiator to be incorporated in the photopolymerizable photosensitive composition to be used in the present invention there may be properly selected from the group consisting of various photopolymerization initiators known in patents and references and combinations of two or more photopolymerization initiators (photopolymerization initiation system).

For example, if a light source emitting a light beam at a wavelength of around 400 nm is used, benzyl, benzoin ether, Michler's ketone, anthraquinone, thioxanthone, acridine, phenazine, benzophenone, etc. find wide application.

Further, for a light source such as one emitting visible light having a wavelength of not less than 400 nm, semiconductor laser emitting secondary harmonic wave and SHG-YAG laser, various photopolymerization initiation systems have been proposed. Examples of such photopolymerization initiation systems include system based on certain kinds of photoreducible dyes as described in U.S. Pat. No. 2,850,445, e.g., Rose Bengal, eosin, erythrosine, or a combination of dye and photopolymerization initiator such as composite polymerization initiation system based on dye and amine (as described in JP-B-44-20189), system based on hexaryl biimidazole, radical generator and dye in combination (as described in JP-B-45-37377), system based on hexaaryl biimidazole and p-dialkylaminobenzylidene ketone (as described in JP-B-47-2528 and JP-A-54-155292), system based on cyclic cis-α-dicarbonyl compound and dye (as described in JP-A-48-84183), system based on cyclic triazine and melocyanine dye (as described in JP-A-54-151024), system based on 3-ketocoumarine (as described in JP-A-52-112681 and JP-A-58-15503), system based on biimidazole, styrene derivative or thiol (as described in JP-A-59-140203), system based on organic peroxide and dye (as described in JP-A-59-1504, JP-A-59-140203, JP-A-59-189340, JP-A-62-174203, JP-B-62-1641, U.S. Pat. No. 4,766,055), system based on dye and active halogen compound (as described in JP-A-63-258903 and JP-A-2-63054), system based on dye and borate compound (as described in JP-A-62-143044, JP-A-62-150242 JP-A-64-13140, JP-A-64-13141, JP-A-64-13142, JP-A-13143, JP-A-64-13144, JP-A-64-17048, JP-A-1-229003, JP-A-1-298348, JP-A-1-138204), system based on dye having rhodanine ring and radical generator (as described in JP-A-2-179643, JP-A-2-244050), system based on titanocene and 3-ketocoumarine dye (as described in JP-A-63-221110), system based on titanocene, xanthene dye and addition-polymerizable ethylenically unsaturated compound having amino or urethane group in combination (as described in JP-A-4-221958, JP-A-4-219756), system based on titanocene and specific melocyanine dye (as described in JP-A-6-295061), and system based on titanocene and dye having benzopyrane ring (as described in JP-A-8-334897).

The amount of such a photopolymerization initiator to be used is from 0 05 to 100 parts by weight, preferably from 0.1 to 70 parts by weight, more preferably from 0.2 to 50 parts by weight based on 100 parts by weight of the ethylenically unsaturated compound.

The photopolymerizable photosensitive composition of the present invention comprises a small amount of a thermal polymerization initiator incorporated therein during the preparation or storage thereof besides the foregoing basic components to inhibit undesirable thermal polymerization of the polymerizable ethylenically unsaturated compound. Preferred examples of the thermal polymerization initiator include hydroquinone, p-methoxyphenol, di-t-butyl-p-cresol, pyrogallol, t-butylcatechol, benzoquinone, 4,4'-thiobis(3-methyl-6 -t-butylphenol), 2,2'-methylenebis(4-methyl-6-t-butylphenol), cerous salt of N-nitrosophenylhydroxylamine, and aluminum salt of N-nitrosophenyl hydroxylamine.

The amount of the thermal polymerization initiator to be used is preferably from about 0. 01% to about 5% based on the total weight of the composition. If necessary, in order to prevent the inhibition of polymerization by oxygen, the photopolymerizable photosensitive composition of the present invention may comprise a higher aliphatic acid derivative such as behenic acid and amide behenate incorporated therein in such an arrangement that it is unevenly distributed on the surface of the photosensitive layer during drying after coating. The amount of such a higher aliphatic acid derivative to be added is preferably from about 0.5% to about 10% based on the total weight of the composition.

The lithographic printing plate comprising a photosensitive layer made of a photosensitive composition of the present invention which is photopolymerizable comprises an oxygen barrier protective layer provided on the photopolymerizable photosensitive layer for the purpose of preventing the inhibition of polymerization by oxygen.

Examples of the water-soluble vinyl polymer to be incorporated in the oxygen barrier protective layer include polyvinyl alcohol, partial ester, ether and acetal thereof, and copolymer containing unsubstituted vinyl alcohol unit in a substantial amount such that they are rendered water-soluble as required. Examples of the polyvinyl alcohol employable herein include those having a percent hydrolyzability of from 71 to 100 and a polymerization degree of from 300 to 2,400.

Specific examples of such a polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 available from KURARAY CO., LTD.

Examples of the foregoing copolymer include polyvinyl acetate chloroacetate, polyvinyl acetate propionate, polyvinyl formal, polyvinyl acetal and copolymer thereof which have been hydrolyzed to an extent of from 88% to 100%. Other useful examples of polymer include polyvinyl pyrrolidone, gelatin, and gum arabic. These polymers may be used singly or in combination.

As the solvent to be used in the application of the oxygen barrier protective layer of the present invention there is preferably pure water. Pure water may be used in admixture with an alcohol such as methanol and ethanol or a ketone such as acetone and methyl ethyl ketone. The concentration of solid content in the coating solution is preferably from 1 to 20% by weight.

The oxygen barrier protective layer of the present invention may comprise a known additive incorporated therein, such as surface active agent for enhancing the coatability thereof and water-soluble plasticizer for improving the physical properties of the film.

Examples of the water-soluble plasticizer employable herein include propionamide, cyclohexanediol, glycerin, and sorbitol. Alternatively, a water-soluble (meth) acrylic polymer or the like may be incorporated in the oxygen barrier protective layer of the present invention.

The coated amount of the oxygen barrier protective layer is preferably from about $0.1/m^2$ to about $15/m^2$, more preferably from about $1.0/m^2$ to about $5.0/m^2$ as calculated in terms of dried amount.

As the printing-out agent for providing a visible image shortly after exposure there may be used a combination of a photosensitive compound which undergoes exposure to release an acid and an organic dye which forms a salt with an acid to change color tone.

Examples of the photosensitive compound which undergoes exposure to release an acid include o-naphthoquinonediazide-4-sulfonic acid halogenide as described in JP-A-50-36,209, trihalomethyl-2-pyrone and trihalomethyl-s-triazine as described in JP-A-53-36,223, various o-naphthoquinonediazide compounds as described in JP-A-55-62,444, 2-trihalomethyl-5-aryl-1,3,4-oxanediazole compound as described in JP-A-55-77, 742, and diazonium salt. These compounds may be used singly or in admixture. The amount of such a photosensitive compound to be used is preferably from 0.3 to 15% by weight based on the total weight of the composition.

The photosensitive composition of the present invention comprises at least one organic dye incorporated therein which changes its color tone by interacting with a photodecomposition product of a compound which undergoes photodecomposition to produce an acidic substance. As such an organic dye there may be used a diphenylmethane dye, triarylmethane dye, thiazine dye, oxazine dye, phenazine dye, xanthene dye, anthraquinone dye, iminonaphthoquinone dye or azomethine dye. Specific examples such an organic dye include brilliant green, eosin, ethyl violet, erythrosine B, methyl green, crystal violet, basic fuchsin, phenolphthalein, 1,3-diphenyltriazine, alizarin red S, thymolphthalein, methyl violet 2B, quinaldine red, rose bengal, thymolsulfophthalein, xylenol blue, methyl orange, orange IV, diphenylthiocarbazone, 2,7-dichlorofluorescein, paramethyl red, congo red, benzopurpurine 4B, α-naphthyl red, nile blue 2B, nile blue A, phenacetarin, methyl violet, malachite green, parafuchsin, oil blue #603 [produced by Orient Chemical Industies Limited], oil pink #312 [produced by Orient Chemical Industies Limited], oil red 5B [produced by Orient Chemical Industies Limited], oil scarlet #308 [produced by Orient Chemical Industries Limited], oil red OG [producedby Orient Chemical Industies Limited], oil red RR [producedby Orient Chemical Industies Limited], oil green #502 [produced by Orient Chemical Industies Limited], spiron red BEH special [produced by Hodogaya Chemical Co., Ltd.], victoria pure blue BOH [produced by Hodogaya Chemical Co., Ltd. ], patent pure blue [produced by SUMITOMOTO-MIKUNI CHEMICAL CO., LTD.], sudan blue II [produced by BASF Inc.], m-cresol purple, cresol red, rhodamine, rhodamine 6G, fast acid violet R, sulforhodamine B, auramine, 4-p-diethylaminophenyliminonaphthoquinone, 2-carboxyanilino-4-p-diethylaminophenyliminonaphthoquinone, 2-carbostearylamino-4-p-dihydroxyethyl-aminophenylimino napthoquinone, p-methoxybenzoyl-p'-diethylamino-o'-methylphenyliminoacetanilide, cyano-p-diethylaminophenyl iminoacetanilide, 1-phenyl-3-methyl-4-p-diethylaminophenyl amino-5-pyrazolone, and -1-β-napthyl-4-p-diethylaminophenyl imino-5-pyrazolone.

Particularly preferred among these organic solvents are triarylmethane dyes. Particularly useful among thee triarylmethane dyes are those having sulfonic acid compound as counter anion as disclosed in JP-A-62-2932471 and JP-A-5-313359.

These dyes may be used singly or in admixture. The amount of such a dye to be added is preferably from 0.3 to 15% by weight based on the total weight of the photosensitive composition. Such a dye may be used in combination with other dyes or pigments as necessary. The amount of the foregoing dye to be used is not more than 70% by weight, preferably not more than 50% by weight based on the total weight of the dyes and pigments used.

The composition of the present invention may further comprise various additives incorporated therein depending on various purposes, such as various resins having hydrophobic group for improving the ink affinity of image such as octylphenol-formaldehyde resin, t-butylphenol-formaldehyde resin, t-butylphenol-benzaldehyde resin, rosin-modified novolak resin and o-naphthoquinonediazidesulfonic acid ester of these modified novolak resins and plasticizers for improving the flexibility of the coat layer such as dibutyl phthalate, dioctyl phthalate, butyl glycolate, tricresyl phosphate and dioctyl adipate. The amount of these additives to be incorporated is preferably from 0.01 to 30% by weight based on the total weight of the composition.

The composition of the present invention may further comprise a known resin for further improving the abrasion resistance of the coat layer incorporated therein. Examples of such a resin include polyvinyl acetal resin, polyurethane resin, epoxy resin, vinyl chloride resin, nylon, polyester resin, and acrylic resin. These resins may be used singly or in admixture. The amount of such a resin to be added is preferably from 2 to 40% by weight based on the total weight of the composition.

The photosensitive composition of the present invention may further comprise a nonionic surface active agent as described in JP-A-62-251740 and JP-A-4-68355 or amphoteric surface active agent as described in JP-A-59-121044 and JP-A-4-13149 incorporated therein to increase the development latitude. Specific examples of the nonionic surface active agent employable herein include soritan tristearate, sorbitan monopalmitate, sorbitan trioleate, monoglyceride stearate, polyoxyethylenesorbitan monoleate, and polyoxyethylene nonyl phenyl ether. Specific examples of the amphoteric surface active agent employable herein include alkyl di(aminoethyl)glycine, alkyl polyaminoethylglycine hydrochloride, Amogen K (trade name of N-tetradecyl-N,N-betaine type surface active agent produced by Dai-ichi Seiyaku Kogyo Co., Ltd.), 2-alkyl-N-carboxyethyl-N-hydroxyethyl imidazolinium betaine, and Lebon 15 (trade name of alkylimidazoline type surface active agent produced by SANYO CHEMICAL INDUSTRIES, LTD.).

The proportion of the foregoing nonionic surface active agent and amphoteric surface active agent in the photosensitive composition is preferably from 0.05 to 15% by weight, more preferably from 0.1 to 5% by weight.

Improvement of Coat Surface Quality

The photosensitive composition of the present invention may comprise a surface active agent for improving the coat surface quality such as fluorine-based surface active agent described in JP-A-62-170950 incorporated therein. The amount of the fluorine-based surface active agent to be added is preferably from 0.001 to 1.0% by weight, more preferably from 0.005 to 0.5% by weight based on the total weight of the photosensitive composition.

The photosensitive composition of the present invention may comprise a yellow dye, preferably a yellow dye having an absorbance at 417 nm of not less than 70% of that at 436 nm, incorporated therein The present invention can be applied to positive-working PS plate comprising the foregoing quinonediazide or compound having an alkali-soluble group protected by an acid-decomposable group and negative-working PS plate comprising a photopolymerization system as well as to the following types of lithographic printing plate materials:

(1) Negative-working lithographic printing plate material comprising diazo resin;
(2) Negative-working lithographic printing plate material comprising photo-crosslinking resin; and
(3) Negative-working laser direct-drawing type lithographic printing plate material comprising alkali-soluble binder, acid generator and acid(heat)crosslinking compound.

The materials to be used as the foregoing types of lithographic printing plate materials will be described hereinafter.

Examples of the diazo resin to be incorporated in the negative-working lithographic printing plate (1) include diazo resin represented by salt of condensate of diazodiarylamine with active carbonyl compound. A photosensitive, water-insoluble and organic solvent-soluble diazo resin is desirable.

Particularly preferred examples of diazo resin include organic acid or inorganic acid salts of condensate of 4-diazodiphenylamine, 4-diazo-3-methyldiphenylamine, 4-diazo-4'-methyldiphenylamine, 4-diazo-3'-methyldiphenylamine, 4-diazo-4'-methoxydiphenylamine, 4-diazo-3-methyl-4'-ethoxy diphenylamine, 4-diazo-3-methoxydiphenlamine or the like with formaldehyde, paraformaldehyde, acetaldehyde, benzaldehyde, 4,4'-bis-methoxymethyldiphenylether or the like.

Examples of the foregoing organic acid include methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, and 2-hydroxy-4-methoxybernzophenone-5-sulfonic acid. Examples of the foregoing inorganic acid include hexafluorophosphoric acid, tetrafluoroboric acid, and thiocyanic acid.

Further examples of the diazo resin employable herein include diazo resin having polyester group as a main chain as described in JP-A-54-30,121, diazo resin obtained by the reaction of a polymer having carboxylic maleic residue with a diazo compound having hydroxyl group as described in JP-A-61-273,538, and diazo resin obtained by the reaction of a polyisocyanate compound with a diazo compound having hydroxyl group.

The amount of such a diazo resin to be used is preferably from 0 to 40% by weight based on the solid content of the composition. Two or more diazo resins may be used in combination as necessary.

If a negative-working photosensitive composition is prepared, an organic polymer binder is normally used as well Examples of such an organic polymer binder include acrylic resin, polyamide resin, polyester resin, epoxy resin, polyacetal resin, polystyrene resin, and novolak resin.

The photosensitive composition may further comprise a known additive such as thermal polymerization inhibitor, dye, pigment, plasticizer and stability improver incorporated therein.

Preferred examples of the dye employable herein include basic oil-soluble dyes such as crystal violet, malachite green, victoria blue, methylene blue, ethyl violet and rhodamine B. Commercially available examples of these basic oil-soluble dyes include "Victoria Pure Blue BOH" (produced by Hodogaya Chemical Co., Ltd.), and "Oil Blue #603" (produced by Oriental Chemical Industries, Ltd.). Examples of the pigment employable herein include phthalocyanine blue, phthalocyanine green, dioxazine violet, and quinacridone red.

Examples of the plasticizer employable herein include diethyl phthalate, dibutyl phthalate, dioctyl phthalate, itributyl phosphate, trioctyl phosphate, tricresyl phosphate, tri(2-chloroethyl)phosphate, and tributyl citrate.

Examples of the known stability improver employable herein include phosphoric acid, phosphorous acid, oxalic acid, tartaric acid, malic acid, citric acid, dipicolinic acid, polyacrylic acid, benzenesulfonic acid, and toluenesulfonic acid.

The amount of these additives to be added depends on their purposes. In practice, however, it is preferably from 0 to 30% by weight based on the solid content of the photosensitive composition.

As the photo-crosslinking resin to be incorporated in the foregoing negative-working lithographic printing plate (2) there is preferably used a photo-crosslinking resin having an affinity for the aqueous alkaline developer. Examples of the photo-crosslinking resin employable herein include copolymer having cinnamic acid group and carboxyl group as described in JP-B-54-15711, polyester resin having phenylenediacrylic residue and carboxyl group as described in JP-A-60-165646, polyester resin having phenylenediacrylic residue and phenolic hydroxyl group as described in JP-A-60-203630, polyester resin having phenylenediacrylic residue and sodium iminodisulfonyl group as described in JP-B-57-42858, polymer having azide group and carboxyl group in its side chain as described in JP-A-59-208552, and polymer having maleimide group in its side chain as described in JP-A-7-295212.

As the alkali-soluble binder and acid generator to be incorporated in the foregoing negative-working lithographic printing plate (3) there may be used the same materials as incorporated in the foregoing positive-working PS plate comprising quinonediazide or compound having an alkali-soluble group protected by an acid-decomposable group. The acid(heat)-crosslinking compound is a compound which undergoes crosslinking in the presence of an acid. Examples of such a compound include aromatic compounds and heterocyclic compounds poly-substituted by hydroxymethyl group, acetoxymethyl group or alkoxymethyl group. Preferred among these compounds are those obtained by the condensation of phenols with aldehydes under basic conditions.

Preferred among these compounds are compounds obtained by the condensation of phenol with formaldehyde under basic conditions as mentioned above, compounds obtained by the condensation of m-cresol with formaldehyde under basic conditions, compounds obtained by the condensation of bisphenol A with formaldehyde under basic conditions, compounds obtained by the condensation of 4,4'-bisphenol with formaldehyde under basic conditions, and compounds disclosed as resol resin in GB Patent 2,082, 339.

The foregoing acid-crosslinking compounds preferably have a weight-average molecular weight of from 500 to 100,000 and a number-average molecular weight of from 200 to 50,000.

Other preferred examples of the acid-crosslinking compound include aromatic compound substituted by alkoxymethyl or oxylanylmethyl group as disclosed in EP-A 0,212, 482, monomer, oligomer-melamine-formaldehyde condensate and urea-formaldehyde condensate as disclosed in EP-A 0,133,216, DE-A 3,634,671 and DE 3,711,264, and alkoxy-substituted compound as disclosed in EP-A 0,212, 482.

Still other preferred examples of the acid-crosslinking compound include melamine-formaldehyde derivatives having at least two free N-hydroxymethyl, N-alkoxymethyl or N-acyloxymethyl groups. Preferred among these melamine-formaldehyde derivatives are N-alkoxymethyl derivatives.

A low molecular or oligomer silanol may be used as a silicon-containing crosslinking agent. Examples of such a low molecular or oligomer silanol include dimethyl-silanediol, diphenyl-silanediol, and oligomer having these units which has already been pre-condensed. As such a low molecular or oligomer silanol there may be used one disclosed in EP-A 0,377,155.

Preferred among the aromatic compounds and heterocyclic compounds poly-substituted by alkoxymethyl group are those having an alkoxymethyl group in the position adjacent to the hydroxyl group, the alkoxy group in the alkoxymethyl group having 18 or less carbon atoms.

The acid-crosslinking compound of the present invention is added in an amount of from 5 to 80% by weight, preferably from 10 to 75% by weight, particularly from 20 to 70% by weight based on the total solid content in the lithographic printing plate material. If the added amount of the acid-crosslinking compound falls below 5% by weight, the resulting lithographic printing plate material comprises a photosensitive layer having a deteriorated durability. On the contrary, if the added amount of the acid-crosslinking compound exceeds 80% by weight, it is unfavorable in storage stability.

(Development and Finishing)

The development of the photosensitive lithographic printing plate is normally carried out with a developer obtained by diluting an alkaline aqueous developer DN-3C produced by Fuji Photo Film Co., Ltd. with water at a ratio of 1:1 using an automatic developing machine 800H produced by Fuji Photo Film Co., Ltd. The photosensitive lithographic printing plate thus developed is immediately coated with a solution obtained by diluting a finishing solution FN-2 produced by Fuji Photo Film Co., Ltd. with water at a ratio of 1:1, and then dried.

The present invention will be further described in the following examples, but the present invention should not be construed as being limited thereto.

The term "%" as used herein is meant to indicate % by weight unless otherwise specified.

EXAMPLE 1

The surface of a JIS A1050 aluminum plate having a thickness of 0.24 mm was grained with a nylon brush and an aqueous suspension of 400 mesh pumice stone, and then thoroughly washed with water. The aluminum plate thus grained was dipped in a 10% aqueous solution of sodium hydroxide at a temperature of 70° C. for 60 seconds so that it was etched, washed with flowing water, neutralized and cleaned with a 20% aqueous solution of HNO3, and then washed with water. The aluminum plate thus treated was then electrolytically roughened with a sinusoidal alternating anodization current of 230 columb/dm$^2$ at $V_A$ of 12.7 V in a 1% aqueous solution of nitric acid. The aluminum plate thus anodized was then measured for surface roughness. The results were 0.55 µm as calculated in terms of $R_a$. Subsequently, the aluminum plate thus anodized was dipped in a 30% aqueous solution of $H_2SO_4$ at a temperature of 55° C. for 2 minutes so that it was desmutted, and then washed with water to prepare a substrate (A) The substrate (A) thus prepared was anodized at a current density of 30 A/dm$^2$ in a 10% aqueous solution (50° C.) f sulfuric acid in such a manner that the amount of the anodization layer reached 2.2 g/m$^2$, sprayed at 15° C. with an aqueous solution having a pH value of 2 attained by the adjustment with sulfuric acid for 10 seconds, and then washed with water to prepare a substrate (B).

EXAMPLE 2

The foregoing substrate (A) was anodized at a current density of 30 A/dm$^2$ in a 10% aqueous solution (50° C.) of sulfuric acid in such a manner that the amount of the anodization layer reached 2.2 g/m$^2$, sprayed at 15° C. with an aqueous solution having a pH value of 3 attained by the adjustment with sulfuric acid for 20 seconds, and then washed with water to prepare a substrate (C).

EXAMPLE 3

The foregoing substrate (A) was anodized at a current density of 30 A/dm$^2$ in a 10% aqueous solution (50° C.) of sulfuric acid in such a manner that the amount of the anodization layer reached 2.2 g/m$^2$, sprayed at 15° C. with an aqueous solution having a pH value of 4 attained by the adjustment with sulfuric acid for 10 seconds, and then washed with water to prepare a substrate (D).

EXAMPLES 4 TO 6

The foregoing substrate (C) was treated with an aqueous solution of No. 3 sodium silicate, and then washed with water to prepare substrates (E-1) to (E-3). The amounts of sodium silicate attached to the substrates (E-1) to (E-3) were 0.3 mg/m$^2$, 1.5 mg/m$^2$ and 7.8 mg/m$^2$, respectively, as calculated in terms of Si atom.

For the measurement of the amount of sodium silicate attached to the substrates (E-1) to (E-3) which had been treated with an aqueous solution of sodium silicate in the foregoing example, calibration curve method using a fluorescent X-ray analyzer was used to determine the amount of Si atom (mg/m$^2$) as mentioned above. In some detail, as the fluorescent X-ray analyzer there was used RIX3000 produced by RIGAKU CORP. Under the following conditions, the height of peak in Si—Kα spectrum was then measured to determine the amount of Si atom.

Apparatus: RIX3000, produced by RIGAKU CORP.

X-ray tube: Rh

Spectrum measured: Si—Kα

Tube voltage: 50 kV

Tube current: 50 mA

Slit: COARSE

Spectral crystal: RX4

Detector: F-PC

Area analyzed: 30 mmφ

Peak position (2θ): 144.75 deg.

Background (2θ): 140.70 deg., 146.85 deg.

Integrating time: 80 sec/sample

The amount of Si atom shown in Example 4 is obtained by subtracting the amount of Si contained in aluminum from the total amount of Si in the substrate.

Comparative Example 1

The foregoing substrate (A) of Example 1 was anodized at a current density of 30 A/dm² in a 10% aqueous solution (50° C.) of sulfuric acid in such a manner that the amount of the anodization layer reached 2.2 g/m², sprayed at 60° C. with an aqueous solution having a pH value of 11 attained by the adjustment with sulfuric acid for 2 minutes, and then washed with water to prepare a substrate (F).

Comparative Example 2

The foregoing substrate (A) of Example 1 was anodized at a current density of 30 A/dm² in a 10% aqueous solution (50° C.) of sulfuric acid in such a manner that the amount of the anodization layer reached 2.2 g/m², treated with water having a pH value of 7 at a temperature of 15° C. for 10 seconds, washed with water, and then treated with a 2.5% aqueous solution of No. 3 sodium silicate at a temperature of 30° C. for 10 seconds to prepare a substrate (G). The amount of sodium silicate attached to the substrate (G) was 4 mg/m₂ as calculated in terms of Si atom.

To each of the foregoing substrates (B) to (D), (F) and (G) was then applied the following interlayer solution (A). The coated substrates were each dried at a temperature of 80° C. for 15 seconds. The amount of the interlayer solution (A) applied to each of the foregoing substrates was 10 mg/m₂ as calculated in terms of dried amount.

| [Interlayer solution A] | |
|---|---|
| β-Alanine | 0.16 g |
| Water content | 10 g |
| Methanol | 90 g |

To the surface of the substrates (E-1) to (E-3) was applied the following solution (B) having an acid group and an onium group described in JP-A-10-69092. The coated substrate was then dried at a temperature of 100° C. for 10 seconds. The amount of the solution (B) applied to the substrate was 6.5⁻ mg/m² as calculated in terms of dried amount.

| [Interlayer solution B] | |
|---|---|
| Polymer compound (B) shown below | 0.14 g |

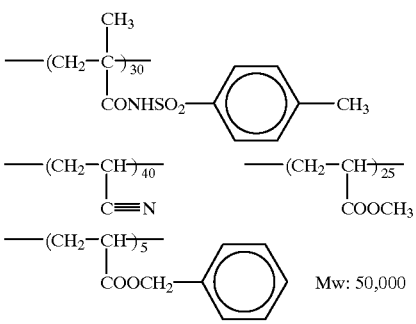

| Methanol | 100 g |
| Water content | 1 g |

Subsequently, to each of the various substrates thus treated was applied the following photosensitive solution (A) to provide a photosensitive layer thereon. The coated amount of the photosensitive layer which had been dried was 1.8 g/m². In order to shorten the time required for vacuum adhesion, a matt layer was then formed on the substrate by a method described in JP-B-61-28986 to prepare a photosensitive lithographic printing plate.

| [Photosensitive solution A] | |
|---|---|
| Esterification product of 1,2-diazonaphthoquinone-5-sulfonylchloride with pyrogallol-acetone resin (as described in Example 1 of U.S. Pat. No. 3,635,709) | 0.8 g |
| Binder | |
| Novolak I (shown below) | 1.50 g |
| Novolak II (shown below) | 0.2 g |
| Resin other than novolak III (shown below) | 0.4 g |

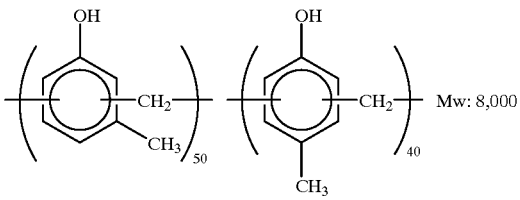

Novolak I

Novolak II

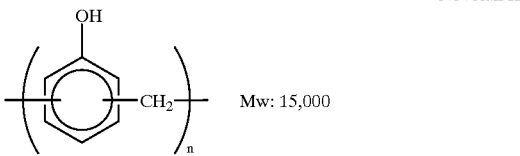

Resin other than novolak III

| P-normal octylphenol-formaldehyde resin (as described in U.S. Pat. No. 4,123,279) | 0.02 g |
| Naphthoquinonediazide-1,2-diazide-4-sulfonic acid chloride | 0.01 g |
| Tetrahydrophthalic anhydride | 0.02 g |
| Benzoic acid | 0.02 g |
| Pyrogallol | 0.05 g |
| Triazine A | 0.07 g |
| Victoria Pure Blue BOH (dye obtained by replacing counter anion in a dye produced by Hodogaya Chemical Co., Ltd. by 1-naphthalenesulfonic acid) | 0.045 g |
| F176PF (fluorine-based surface active agent, produced by DAINIPPON INK & CHEMICALS, INC.) | 0.01 g |

-continued

| | |
|---|---|
| Methyl ethyl ketone | 15.0 g |
| 1-Methoxy-2-propanol | 10 g |

The photosensitive lithographic printing plate thus prepared was imagewise exposed to light from a 3 kW metal halide lamp disposed at a distance of 1 m therefrom for 1 minute, and then subjected to development with the following developer using a Type 900VR PS processor produced by Fuji Photo Film Co., Ltd.

Developer

| | |
|---|---|
| Aqueous solution of sodium silicate having [$SiO_2$]/[$Na_2O$] molar ratio of 1.2 and $SiO_2$ concentration of 1.4% by weight | 100 parts by weight |
| Ethylenediamine-ethylene oxide adduct (30 mols) | 0.03 part by weight |

The method for evaluation of scumming of the lithographic printing plate thus developed will be described below. Scumming: Using a Type SOR-M printing machine produced by Heidelberg Inc., the lithographic printing plate was subjected to printing on 1,000 sheets of paper. After suspension of printing, the lithographic printing plate was allowed to stand for 30 minutes. The lithographic printing plate was again mounted on the printing machine. Printing was effected on 100 sheets of paper.

During printing, the lithographic printing plate was observed to see how the ink was wiped off the non-image area. The evaluation was made in accordance with the following criteria:

G . . . Ink can be wiped quickly (hardly scummed)

F . . . Ink is wiped slowly but not so slowly as P

P . . . Ink is wiped slowly (easily scummed)

Defective external appearance due to attachment of aluminum hydroxide:

The substrates (A) to (G) prepared in the foregoing examples and comparative examples were then visually evaluated to see how aluminum hydroxide is attached to the aluminum support.

G . . . No defective external appearance due to attachment of aluminum hydroxide observed;

F . . . Sight defective external appearance due to attachment of aluminum hydroxide observed;

P . . . Defective external appearance due to attachment of aluminum hydroxide observed The results are set forth in Table 1 below.

TABLE 1

| Example No. | Acidic aqueous solution | No. 3 sodium silicate | Si amount (mg/m$^2$) | Scumming | Defective external appearance* |
|---|---|---|---|---|---|
| Example 1 | pH 2 | None | 0 | G | G |
| Example 2 | pH 3 | None | 0 | G | G |
| Example 3 | pH 4 | None | 0 | G | G |
| Example 4 | pH 3 | Added | 0.3 | G | G |
| Example 5 | pH 3 | Added | 1.5 | G | G |
| Example 6 | pH 3 | Added | 7.8 | G | G |
| Comparative Example 1 | pH 1 | None | 0 | P | F |
| Comparative Example 2 | pH 7 | Added | 4.0 | F | P |

*Defective external appearance due to attachment of aluminum hydroxide

In accordance with the present invention, a photosensitive lithographic printing plate which is not liable to ink stain on the non-image area and defective external appearance due to attachment of aluminum hydroxide can be prepared.

While the invention has been described in detail and with reference to specific embodiments thereof, it will be apparent to one skilled in the art that various changes and modifications can be made therein without departing from the spirit and scope thereof.

What is claimed is:

1. A process for the preparation of a photosensitive lithographic printing plate which comprises providing a photosensitive layer on an aluminum support obtained by anodizing an aluminum substrate in a solution comprising an electrolytic component and, immediately after anodizing, treating the anodized aluminum substrate with an acidic aqueous solution comprising the electrolytic component and having a pH value of from 1.5 to 5.

2. A process for the preparation of a photosensitive lithographic printing plate which comprises anodizing an aluminum substrate in a solution comprising an electrolytic component and, immediately after anodizing, treating the anodized aluminum substrate with an acidic aqueous solution comprising the electrolytic component and having a pH value of from 1.5 to 5, treating said anodized aluminum substrate with a silicate of alkaline metal to obtain an aluminum support, and then providing a photosensitive layer on said aluminum support.

3. A process for the preparation of a photosensitive lithographic printing plate which comprises anodizing an aluminum substrate in a solution comprising an electrolytic component and, immediately after anodizing, treating the anodized aluminum substrate with an acidic aqueous solution comprising the electrolytic component and having a pH value of from 1.5 to 5, treating said anodized aluminum substrate with a silicate of alkaline metal so that the amount of Si atom attached to the aluminum support thus obtained is from 0.1 to 8 mg/m$^2$, and then providing a positive-working photosensitive layer on said aluminum support.

* * * * *